United States Patent
Thareja et al.

(10) Patent No.: US 12,113,097 B2
(45) Date of Patent: *Oct. 8, 2024

(54) FERROELECTRIC CAPACITOR INTEGRATED WITH LOGIC

(71) Applicant: Kepler Computing Inc., San Francisco, CA (US)

(72) Inventors: Gaurav Thareja, Santa Clara, CA (US); Sasikanth Manipatruni, Portland, OR (US); Rajeev Kumar Dokania, Beaverton, OR (US); Ramamoorthy Ramesh, Moraga, CA (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/056,240

(22) Filed: Nov. 16, 2022

(65) Prior Publication Data

US 2023/0077581 A1    Mar. 16, 2023

Related U.S. Application Data

(63) Continuation of application No. 16/795,404, filed on Feb. 19, 2020, now Pat. No. 11,522,044, which is a
(Continued)

(51) Int. Cl.
*G11C 11/22* (2006.01)
*H01L 49/02* (2006.01)
*H10B 53/00* (2023.01)

(52) U.S. Cl.
CPC ............ *H01L 28/56* (2013.01); *G11C 11/221* (2013.01); *H01L 28/75* (2013.01); *H10B 53/00* (2023.02)

(58) Field of Classification Search
None
See application file for complete search history.

(56) References Cited

U.S. PATENT DOCUMENTS

| 5,479,317 A | 12/1995 | Ramesh |
| 5,519,235 A | 5/1996 | Ramesh |

(Continued)

FOREIGN PATENT DOCUMENTS

| GB | 2323188 A | 9/1998 |
| JP | 10242426 | 9/1998 |

(Continued)

OTHER PUBLICATIONS

Final Office Action notified Apr. 14, 2023 for U.S. Appl. No. 17/345,964.
(Continued)

*Primary Examiner* — Evren Seven
(74) *Attorney, Agent, or Firm* — MUGHAL GAUDRY & FRANKLIN PC

(57) ABSTRACT

Ferroelectric capacitor is formed by conformably depositing a non-conductive dielectric over the etched first and second electrodes, and forming a metal cap or helmet over a selective part of the non-conductive dielectric, wherein the metal cap conforms to portions of sidewalls of the non-conductive dielectric. The metal cap is formed by applying physical vapor deposition at a grazing angle to selectively deposit a metal mask over the selective part of the non-conductive dielectric. The metal cap can also be formed by applying ion implantation with tuned etch rate. The method further includes isotopically etching the metal cap and the non-conductive dielectric such that non-conductive dielectric remains on sidewalls of the first and second electrodes but not on the third and fourth electrodes.

23 Claims, 11 Drawing Sheets

Related U.S. Application Data continuation of application No. 16/729,267, filed on Dec. 27, 2019, now Pat. No. 11,430,861.

(56) References Cited

U.S. PATENT DOCUMENTS

| | | |
|---|---|---|
| 5,651,857 A | 7/1997 | Cronin et al. |
| 5,716,875 A | 2/1998 | Jones, Jr. et al. |
| 5,777,356 A | 7/1998 | Dhote et al. |
| 6,066,868 A | 5/2000 | Evans, Jr. |
| 6,115,281 A | 9/2000 | Aggarwal et al. |
| 6,117,688 A | 9/2000 | Evans, Jr. et al. |
| 6,194,754 B1 | 2/2001 | Aggarwal et al. |
| 6,211,035 B1 | 4/2001 | Moise et al. |
| 6,274,388 B1 | 8/2001 | Aggarwal et al. |
| 6,344,413 B1 | 2/2002 | Zurcher et al. |
| 6,346,741 B1 | 2/2002 | Buskirk et al. |
| 6,440,815 B1 | 8/2002 | Mitsuhashi |
| 6,587,367 B1 | 7/2003 | Nishimura et al. |
| 6,656,748 B2 | 12/2003 | Hall et al. |
| 6,713,342 B2 | 3/2004 | Celii et al. |
| 6,720,600 B2 | 4/2004 | Okita |
| 6,728,128 B2 | 4/2004 | Nishimura et al. |
| 7,029,925 B2 | 4/2006 | Celii et al. |
| 7,435,683 B2 | 10/2008 | Kavalieros et al. |
| 7,935,543 B2 | 5/2011 | Moise, IV et al. |
| 8,183,109 B2 | 5/2012 | Izumi et al. |
| 8,362,533 B2 | 1/2013 | Ozaki |
| 9,991,270 B2 | 6/2018 | Wang |
| 11,289,497 B2 | 3/2022 | Thareja et al. |
| 11,482,528 B2 | 10/2022 | Thareja |
| 2003/0119211 A1 | 6/2003 | Summerfelt et al. |
| 2004/0135182 A1 | 7/2004 | An et al. |
| 2006/0179329 A1 | 8/2006 | Terechko et al. |
| 2007/0029676 A1 | 2/2007 | Takaura et al. |
| 2008/0038846 A1 | 2/2008 | Park et al. |
| 2008/0224194 A1 | 9/2008 | Sashida |
| 2008/0265298 A1 | 10/2008 | Ozaki |
| 2009/0008743 A1 | 1/2009 | Lee et al. |
| 2009/0298201 A1 | 12/2009 | Nagai |
| 2010/0320518 A1 | 12/2010 | Ozaki |
| 2012/0098140 A1 | 4/2012 | Bartley et al. |
| 2012/0107965 A1 | 5/2012 | Sashida |
| 2013/0086395 A1 | 4/2013 | Liu |
| 2013/0264620 A1 | 10/2013 | Yu et al. |
| 2014/0030824 A1 | 1/2014 | Wang |
| 2015/0072441 A1 | 3/2015 | Sun |
| 2016/0225423 A1 | 8/2016 | Naik et al. |
| 2017/0287920 A1 | 10/2017 | Wang |
| 2017/0300269 A1 | 10/2017 | Um |
| 2018/0350773 A1 | 12/2018 | Saito |
| 2019/0027535 A1 | 1/2019 | Kumar et al. |
| 2019/0065204 A1 | 2/2019 | Jean |
| 2019/0259807 A1 | 8/2019 | Kumar et al. |
| 2020/0076424 A1 | 3/2020 | Dubey et al. |
| 2020/0105772 A1 | 4/2020 | Chen et al. |
| 2020/0107444 A1 | 4/2020 | Hoe et al. |
| 2021/0111333 A1 | 4/2021 | Chang et al. |
| 2021/0134724 A1 | 5/2021 | Rubin et al. |
| 2021/0202507 A1 | 7/2021 | Thareja et al. |
| 2021/0202690 A1 | 7/2021 | Thareja et al. |
| 2021/0335718 A1 | 10/2021 | Cheah et al. |
| 2022/0367400 A1 | 11/2022 | Li |

FOREIGN PATENT DOCUMENTS

| | | |
|---|---|---|
| TW | 200403814 A | 3/2004 |
| TW | 201241936 A | 10/2012 |
| TW | 201526206 A | 7/2015 |
| TW | 201715707 A | 5/2017 |
| TW | 201830585 A | 8/2018 |
| TW | 201830664 A | 8/2018 |
| TW | 201915624 A | 4/2019 |
| TW | 201917870 A | 5/2019 |
| TW | 201946052 A | 12/2019 |
| TW | 201946218 A | 12/2019 |
| TW | I773050 B | 8/2022 |
| TW | I776328 B | 9/2022 |
| WO | 2012078162 A1 | 6/2012 |

OTHER PUBLICATIONS

Final Office Action notified Apr. 17, 2023 for U.S. Appl. No. 17/499,241.
Final Office Action notified May 10, 2023 for U.S. Appl. No. 17/346,090.
Lexinnova, 3D Stacked Memory, retrieved from the Internet by USPTO 2017, 23 pages.
Martin et al., "Thin-Film Ferroelectric Materials and Their Applications," in Nature Reviews Materials, vol. 2, Article No. 16087; doi: 10.1038/natrevmats.2016.87. Published online Nov. 15, 2016 (15 pages).
Non-Final Office Action notified Dec. 2, 2022 for U.S. Appl. No. 17/654,521.
Non-Final Office Action notified Feb. 2, 2023 for U.S. Appl. No. 17/663,187.
Non-Final Office Action notified Mar. 3, 2023 for U.S. Appl. No. 17/449,240.
Non-Final Office Action notified Mar. 13, 2023 for U.S. Appl. No. 17/345,964.
Non-Final Office Action notified Mar. 13, 2023 for U.S. Appl. No. 17/346,094.
Non-Final Office Action notified Mar. 14, 2023 for U.S. Appl. No. 17/346,090.
Non-Final Office Action notified Mar. 24, 2023 for U.S. Appl. No. 17/408,326.
Notice of Allowance notified Apr. 13, 2023 for U.S. Appl. No. 17/478,841.
Notice of Allowance notified Aug. 22, 2023 for Taiwan Patent Application No. 111131838.
Notice of Allowance notified Jan. 5, 2023 for U.S. Appl. No. 17/654,521.
Notice of Allowance notified Jun. 15, 2023 for U.S. Appl. No. 17/346,090.
Notice of Allowance notified May 18, 2023 for U.S. Appl. No. 17/663,187.
Notice of Allowance notified May 22, 2023 for U.S. Appl. No. 17/345,964.
Notice of Allowance notified May 23, 2023 for U.S. Appl. No. 17/346,094.
Office Action notified Jun. 5, 2023 for Taiwan Patent Application No. 111131838.
Restriction Requirement notified May 1, 2023 for U.S. Appl. No. 17/230,889.
Wikipedia. Ferroelectric RAM. retrieved from the Internet by USPTO Feb. 21, 2023, https://en.wikipedia.org/wiki/Ferroelectric_RAM, 8 pages.
Advisory Action notified May 20, 2022 for U.S. Appl. No. 17/795,404.
Chandler, T. "An adaptive reference generation scheme for 1T1C FeRAMs", 2003 Symposium on VLSI Circuits. Digest of Technical Papers (IEEE Cat. No. 03CH37408), Kyoto, Japan, 2003, pp. 173-174.
Final Office Action notified Mar. 9, 2022 for U.S. Appl. No. 16/795,404.
International Preliminary Report on Patentability notified Jul. 7, 2022 for PCT Patent Application No. PCT/2020/066958.
International Preliminary Report on Patentability notified Jul. 7, 2022 for PCT Patent Application No. PCT/US2020/066950.
International Preliminary Report on Patentability notified Jul. 7, 2022 for PCT Patent Application No. PCT/US2020/066955.
International Search Report & Written Opinion notified Apr. 15, 2021 for PCT Patent Application No. PCT/US2020/066950.
International Search Report & Written Opinion notified Apr. 21, 2021 for PCT Patent Application No. PCT/JS2020/066955.
International Search Report & Written Opinion notified Apr. 22, 2021 for PCT Patent Application No. PCT/US2020/066958.

(56) References Cited

OTHER PUBLICATIONS

Jung, D. et al., "Highly manufacturable 1T1C 4 Mb FRAM with novel sensing scheme, International Electron Devices Meeting 1999. Technical Digest (Cat. No. 99CH36318), Washington, DC, USA, 1999, pp. 279-282.", International Electron Devices Meeting 1999. Technical Digest (Cat. No. 99CH36318), Washington, DC, USA, 1999, pp. 279-282.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Non-Final Office Action notified Aug. 3, 2021 for Taiwanese Patent Application No. 109146059.

Non-Final Office Action notified Aug. 18, 2022 for U.S. Appl. No. 16/795,404.

Non-Final Office Action notified Jan. 26, 2022 for U.S. Appl. No. 16/729,278.

Non-Final Office Action notified Jul. 8, 2021 for U.S. Appl. No. 16/729,267.

Non-Final Office Action notified Jun. 8, 2022 for U.S. Appl. No. 16/729,267.

Non-Final Office Action notified Oct. 28, 2021 for U.S. Appl. No. 16/795,04

Notice of Allowance (2) notified Jun. 27, 2022 for U.S. Appl. No. 16/729,267.

Notice of Allowance notified Apr. 28, 2022 for Taiwan Patent Application No. 109146060.

Notice of Allowance notified Aug. 29, 2022 for Taiwan Patent Application No. 109146059.

Notice of Allowance notified Jan. 5, 2022 for U.S. Appl. No. 16/729,273.

Notice of Allowance notified Jun. 9, 2022 for U.S. Appl. No. 16/729,278.

Notice of Allowance notified Mar. 11, 2022 for U.S. Appl. No. 16/729,267.

Notice of Allowance notified May 24, 2022 for Taiwan Patent Application No. 109146058.

Notice of Allowance notified Oct. 3, 2022 for U.S. Appl. No. 16/795,404.

Office Action notified Nov. 2, 2021 for Taiwan Patent Application No. 109146058.

Office Action notified Sep. 6, 2021 for Taiwan Patent Application No. 109146060.

Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.

Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.

Restriction Requirement notified Mar. 26, 2021 for U.S. Appl. No. 16/729,267.

Restriction Requirement notified Nov. 9, 2021 for U.S. Appl. No. 16/729,278.

Second Office Action notified Apr. 11, 2022 for TW Patent Application No. 109146059.

Second Office Action notified Feb. 21, 2022 for Taiwan Patent Application No. 109146058.

Second Office Action notified Mar. 10, 2022 for Taiwan Patent Application No. 109146059.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.

Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.

Non-Final Office Action notified Jul. 5, 2024 for U.S. Appl. No. 18/357,974.

Non-Final Office Action notified Jul. 5, 2024 for U.S. Appl. No. 18/360,764.

Notice of Allowance notified Jul. 23, 2024 for U.S. Appl. No. 18/357,974.

Notice of Allowance notified May 10, 2024 for Korean Patent Application No. 10-2022-7026060.

FERROELECTRIC CAPACITOR INTEGRATED WITH LOGIC

CLAIM OF PRIORITY

This application is a Continuation of, and claims the benefit of priority to, U.S. patent application Ser. No. 18/056,240 filed Nov. 11, 2022, which is a Continuation of, and claims benefit of priority to U.S. patent application Ser. No. 16/795,404, filed Feb. 19, 2020, which is a Continuation of, and claims the benefit of priority to, U.S. patent application Ser. No. 16/729,267, filed on Dec. 27, 2019, and titled, "FERROELECTRIC CAPACITOR AND METHOD OF PATTERNING SUCH," and now issued as U.S. Pat. No. 11,430,861 on Aug. 30, 2022, which is incorporated by reference it its entirety.

BACKGROUND

The standard memory used in processors is static random access memory (SRAM) or dynamic random access memory (DRAM), and their derivatives. These memories are volatile memories. For example, when power to the memories is turned off, the memories lose their stored data. Non-volatile memories are now also commonly used in computing platforms to replace magnetic hard disks. Non-volatile memories retain their stored data for prolonged periods (e.g., months, years, or forever) even when power to those memories is turned off. Examples of non-volatile memories are magnetic random access memory (MRAM), NAND, or NOR flash memories. These memories may not be suitable for low power and compact computing devices because these memories suffer from high write energy, low density, and high power consumption.

The background description provided here is for the purpose of generally presenting the context of the disclosure. Unless otherwise indicated here, the material described in this section is not prior art to the claims in this application and is not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
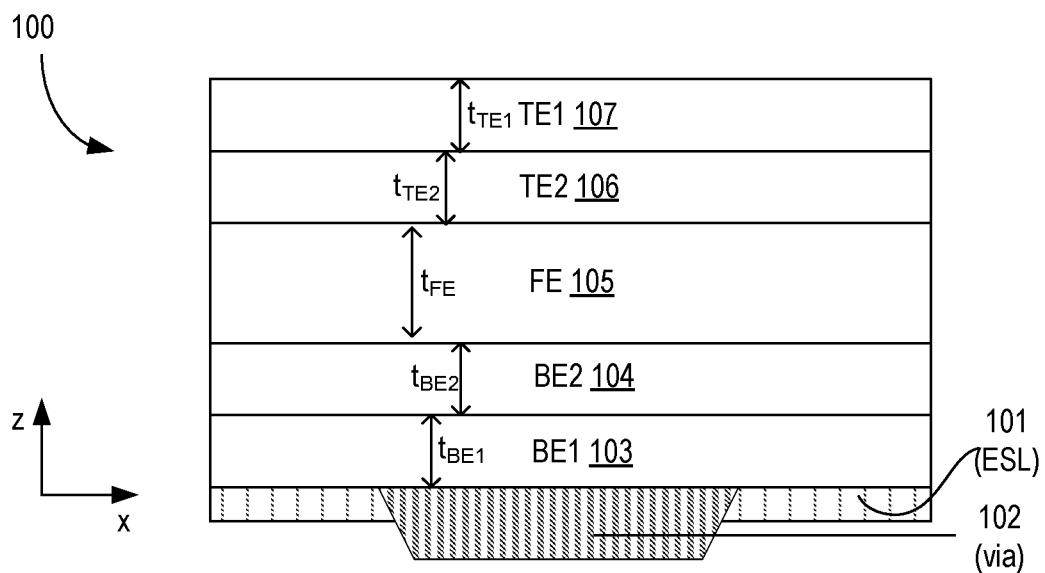
FIGS. 1A-F illustrate cross-sections of processes of forming/patterning a ferroelectric capacitor, in accordance with some embodiments.

Some embodiments describe a ferroelectric capacitor and method of fabricating or patterning such. The method for forming the ferroelectric capacitive device comprises depositing a stack of layers that form the basis of the ferroelectric capacitor device. This stack of layers includes a first electrode comprising first conductive material, a second electrode comprising second conductive material, a structure with ferroelectric material, a third electrode comprising third conductive material, and fourth electrode comprising fourth conductive material. The first and second electrodes are part of a top electrode (TE), while the third and fourth electrodes are part of a bottom electrode (BE). While two electrodes are assumed for the top electrode, any number of layers can be stacked to form a multi-layer top electrode. The same applies to the bottom electrode. For example, the top and/or bottom electrodes may comprise a single layer or multiple layers. The number of layers for the top and bottom electrodes may be the same or different. The second electrode is adjacent to the first electrode, the ferroelectric material is adjacent to the second electrode, the third electrode is adjacent to the ferroelectric material, and the fourth electrode is adjacent to the third electrode.

The method further comprises etching the first and second electrodes. The etching process may stop at the ferroelectric material, or may stop at the point where the third electrode is about to start. After etching the first and second electrodes (and/or the ferroelectric material), the method comprises conformably depositing a non-conductive dielectric over the etched first and second electrodes (and/or the ferroelectric material). One purpose of this non-conductive dielectric is to prevent shorting of the top electrode(s) from the bottom electrode(s). Traditional methods of fabricating a ferroelectric capacitor for advanced process technology nodes (e.g., 12 nm and below CMOS processes) often struggle with keeping the TE and BE from shorting during fabrication. The method herein addresses this challenge, which allows for fabricating ferroelectric capacitors for advanced technology nodes such as 7 nm and below.

The method further comprises forming a metal cap over a selective part of the non-conductive dielectric, wherein the metal cap conforms to portions of sidewalls of the non-conductive dielectric. This metal cap is also referred to as a helmet. The hangover part of the helmet conforms to the portions of sidewalls of the non-conductive dielectric, while the top part of the helmet covers the first electrode. In some embodiments, the helmet is formed by applying physical vapor deposition (PVD) at a grazing angle to selectively deposit a metal mask over the selective part of the non-conductive dielectric. In some embodiments, the helmet is formed by applying ion implantation with a tuned etch rate.

The method further comprises isotopically etching the metal cap and the non-conductive dielectric such that non-conductive dielectric remains on sidewalls of the first and second electrodes but not on the sidewalls of third and fourth electrodes. In some embodiments, the metal cap is removed from a lateral surface of the non-conductive dielectric by etching or polishing the metal cap. For example, the top section of the helmet is polished and trimmed down to the surface of the first electrode. The helmet hangover may still remain. In some embodiments, the helmet hangover may be removed too.

There are many technical effects of various embodiments. For example, the process of forming the ferroelectric capacitor makes sure that the top and bottom electrodes are not shorted during fabrication that may result in an inoperable capacitor. As a FE cell is aggressively scaled, it faces issues due to etching. The etch processes may create nonvolatile etch byproducts. These etch by-products, which may originate from electrode material, may redeposit on the FE layer during etch processing and may cause electrical shorting between the electrodes. A spacer of non-electrical conducting material is used to separate top and bottom electrodes of the device to prevent device failure from electrical shorting. As such, the process of various embodiments protects the ferroelectric capacitor during further fabrication of a memory array.

A memory bit-cell formed using the ferroelectric capacitor allows for very low voltage switching (e.g., 100 mV) of a ferroelectric (FE) state in the ferroelectric capacitor. The ferroelectric capacitor can be used with any type of transistor. For example, the ferroelectric capacitor of various embodiments can be used with planar or non-planar transistors. The transistors can be formed in the frontend or backend of a die. The memory bit-cell formed using the ferroelectric capacitor results in a taller and narrower bit-cell compared to traditional DRAM bit-cells. As such, more bit-cells can be packed in a die resulting in a higher density memory that can operate at lower voltages than traditional DRAMs while providing the much sought after non-volatility behavior. In some embodiments, the memory bit-cells are formed in the frontend and backend to further increase the density of the memory per die. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal," and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The terms "left" "right," "front," "back,", "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIGS. 1A-F illustrate cross-sections 100, 120, 130, 140, 150, and 160, respectively, of processes of forming/patterning a ferroelectric capacitor, in accordance with some embodiments. The process described herein assumes certain prior processes already performed. For example, presence of an etch stop layer (ESL) 101 under a bottom electrode (BE1), the process of making a metal via 102 to connect the bottom electrode (BE1) with another device or metal, etc. A person skilled in the art would appreciate that substrate (not shown) is below via 102 and may have active devices formed therein or thereon. ESL 101 may include any suitable material that has very different etch characteristics than materials of the stack (e.g., layers 103, 104, 105, 106, and 107) to be etched. The process of etching stops at ESL 101. Via 102 may include any suitable material such as W, Cu, Ta, Ti, Co, Al, Ag, TaN, or a combination of them.

In cross-section 100, after ESL 101 and via 102 are deposited and patterned, the ferroelectric (FE) capacitive layers are deposited. These layers include BE1 103, BE2 104, FE 105, TE2 106, and TE1 107. In some embodiments, the stack of layers is deposited using the techniques of physical vapor deposition (PVD), chemical vapor deposition (CVD), and/or atomic layer deposition (ALD). The deposition of these layers can be integrated or de-integrated. For example, BE1 103, BE2 104, FE 105, TE2 106, and TE1 107 are deposited in the following sequence: BE1 103 and BE2 104 are deposited and then after an air break, FE 105 is deposited over BE2 104. TE 106 is then deposited over FE 105 after an air break. In some embodiments, BE1 103, BE2, 104, FE 105, TE2 106, and TE1 107 are deposited in the following sequence: BE1 103 and BE2 104 are deposited and then without any air break, FE 105 is deposited over BE2 104. TE 106 is then deposited over FE 105 without an air break. In some embodiments, to improve various film properties, the process of annealing is integrated with deposition of BE1 102, BE2, 104, FE 105, TE2 106, and TE1 107. For example, BE1 102, BE2, 104, FE 105, TE2 106, and TE1 107 are deposited in the following sequence: BE1 102 and BE2 104 are deposited and annealed and then without any air break, FE 105 is deposited over BE2 104 and annealed. TE 106 is then deposited over FE 105 without an air break and annealed.

Film properties include one or more of: adhesion, hermeticity, structure, resistance, ferroelectricity, reliability, etc. In this process BE1 132 and BE2 104 are deposited followed by annealing. Annealing is controlled at a ramp rate within a particular temperature range in the presence of certain materials. For example, annealing is performed at a controlled rate of 0.1 C/min (Celsius per minute), temperature range of 300° C. to 900° C., and ambient N2, O2, NH3, N2O, Ar, or a combination thereof, for a time duration ranging from 1 ns to 30 minutes. Any suitable heat source can be used for annealing. For example, laser, lamp, or furnace can be used as the heat source.

While two layers for bottom electrode (BE) are shown (e.g., BE1 and BE2), any number of N layers can be used for forming the bottom electrode (BE), where N is 1 to any suitable number. Similarly, while two layers for top electrode (TE) are shown (e.g., TE1 and TE2), any number of M layers can be used for the top electrode (TE), where M is 1 to any suitable number. In some embodiments, N is equal to M. In some embodiments, N is different from M. The thickness of each layer in the stack is in a range of 1 nm (nanometer) to 50 nm. For example, thickness $t_{BE1}$ of BE1 103, thickness $t_{BE2}$ of BE2 104, thickness $t_{FE}$ of FE 105, thickness $t_{TE2}$ of TE2 106, and thickness $t_{TE1}$ of TE1 107 along the z-axis is in a range of 1 nm to 50 nm.

In some embodiments, BE1 103, BE2 104, TE2 106, and TE1 107 comprise a conductive material, which includes one or more of: Ti, TiN, Ru, RuO2, IrO2, TaN, SrO, Ta, Cu, Co, W, or WN. In some embodiments, the electrodes directly adjacent to FE 105 comprise conductive oxides. In some embodiments, the conductive oxides are of the type AA'BB'O₃. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency as site A, with a different ferroelectric polarizability. The materials for the electrodes may be the same or different. For example, material for TE2 106 is different from the material of TE1 107, and material for BE1 103 is different from the material for BE2 104, while materials BE1 103 and TE1 107 may be the same, and materials BE2 104 and TE2 106 may be the same. In various embodiments, the materials for TE1, TE2, BE1, and BE2 can all be different from one another.

In various embodiments, FE material 105 can be any suitable low voltage FE material that allows the FE material to switch its state by a low voltage (e.g., 100 mV). In some embodiments, FE material 105 comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted $BiFeO_3$, $BiCrO_3$, $BiCoO_3$ class of materials, La or rare earth substitution into the Bi site can tune the spontaneous distortion. In some embodiments, FE material 105 is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, and $LaNiO_3$.

In some embodiments, FE material 105 comprises a stack of layers including low voltage FE material between (or sandwiched between) conductive oxides. In various embodiments, when FE material 105 is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency as site A, with a different ferroelectric polarizability. In some embodiments, the perovskite includes one of: $BaTiO_3$, $PbTiO_3$, $KNbO_3$, $NaTaO_3$, $LaCoO_3$, $SrCoO_3$, $SrRuO_3$, $LaMnO_3$, $SrMnO_3$, $YBa_2Cu_3O_7$, $Bi_2Sr_2CaCu_2O_8$, or $LaNiO_3$.

In some embodiments, FE material 105 comprises hexagonal ferroelectrics of the type h-$RMnO_3$, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when FE material 105 comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, FE material 105 comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials $PbTiO_3$ (PTO) and $SnTiO_3$ (STO), respectively, and $LaAlO_3$ (LAO) and STO, respectively. For example, a super lattice of [PTO/STO]n or [LAO/STO]n, where 'n' is between 1 to 100. While various embodiments here are described with reference to ferroelectric material 105 for storing the charge state, the embodiments are also applicable for paraelectric material. For example, the capacitor of various embodiments can be formed using paraelectric material instead of ferroelectric material.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: $SrTiO_3$, $Ba(x)Sr(y)TiO_3$ (where x is −0.05, and y is 0.95), $HfZrO_2$, Hf—Si—O, La-substituted $PbTiO_3$, PMN-PT based relaxor ferroelectrics.

In some embodiments, the non-linear polar material of capacitor 105 includes one of: ferroelectric (FE) material, paraelectric material, relaxor ferroelectric, or non-linear dielectric.

In some embodiments, FE material 105 includes one or more of: hafnium (Hf), zirconium (Zr), aluminum (Al), silicon (Si), their oxides or their alloyed oxides. In some embodiments, FE material 105 includes one or more of: $Al(1-x)Sc(x)N$, $Ga(1-x)Sc(x)N$, $Al(1-x)Y(x)N$ or $Al(1-x-y)Mg(x)Nb(y)N$, y doped $HfO_2$, where x includes one of: Al, Ca, Ce, Dy, Er, Gd, Ge, La, Sc, Si, Sr, Sn, or Y, wherein 'x' is a fraction.

In some embodiments, FE material 105 includes bismuth ferrite (BFO), BFO with a doping material where in the doping material is one of lanthanum, or any element from the lanthanide series of the periodic table. In some embodiments, FE material 105 includes lead zirconium titanate (PZT), or PZT with a doping material, wherein the doping material is one of La, Nb; and relaxor ferroleectrics such as PMN-PT. In some embodiments, FE material 105 includes a relaxor ferroelectric includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), barium titanium-barium strontium titanium (BT-BST).

In some embodiments, FE material 105 includes Hafnium oxides of the form, $Hf_{1-x} E_x O_y$ where E can be Al, Ca, Ce, Dy, er, Gd, Ge, La, Sc, Si, Sr, Sn, or Y. In some embodiments, FE material 105 includes niobate type compounds $LiNbO_3$, $LiTaO_3$, lithium iron tantalum oxy fluoride, barium strontium niobate, sodium barium niobate, or potassium strontium niobate.

Threshold in FE material 105 has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in $PbTiO_3$ a P-E (polarization-electric field) square loop can be modified by La or Nb substitution to create a S-shaped loop. The shape can be systematically tuned to ultimately yield a non-linear dielectric. The squareness of the FE switching can also be changed by the granularity of the FE layer. A perfectly epitaxial, single crystalline FE layer will show higher squareness (e.g., ratio is closer to 1) compared to a poly crystalline FE. This perfectly epitaxial can be accomplished by the use of lattice matched bottom and top electrodes. In one example, BiFeO (BFO) can be epitaxially synthesized using a lattice matched $SrRuO_3$ bottom electrode yielding P-E loops that are square. Progressive doping with La will reduce the squareness.

In some embodiments, FE material 105 comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, FE material 105 comprises organic material. For example, polyvinylidene fluoride or polyvinylidene difluoride (PVDF).

In some embodiments, a layer (not shown) over TE1 107 or below BE1 103 that couples to a transistor comprises a barrier material. The barrier material may be formed of refractive inter-conductive material (e.g., Ti—Al, Ti, V, Cr, Mn, Zr, Nb, Mo, Tc, Ru, Rh, Hf, Ta, W, Re, Os, Ir, Al, or Co). In some embodiments, the barrier layer is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer are matched with the lattice parameters of the conductive oxides and/or the FE material 105.

In some embodiments, BE2 104 and TE2 106 include conductive oxides. In some embodiments, when conductive perovskite is used for FE material 105, conductive oxides can include one or more of: $IrO_2$, $RuO_2$, $PdO_2$, $OsO_2$, or $ReO_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides for BE2 104 and TE2 106.

In some embodiments, BE2 104 and TE2 106 include one or more of binary conductive oxides, perovskite templated conductors, conductive perovskites, hexagonal metal oxides, spinels, or cubic oxides. In some embodiments, binary conductive oxides include one or more of: $IrO_2$, $RuO_2$, $PdO_2$, $OsO_2$, or $ReO_3$. In some embodiments, perovskite templated conductors comprise templated structure. A templated structure is a thin layer (approximately 10 nm) of a perovskite conductor (such as SrRuO3) which is coated on top of IrO2, RuO2, PdO2, PtO2 (which has a non-perovskite structure but higher conductivity) to provide a seed or template for the growth of pure perovskite ferroelectric at low temperatures. In some embodiments, conductive perovskites include one or more of: La $CoO_3$, $SrCoO_3$, $SrRuO_3$, $LaMnO_3$, $SrMnO_3$, $YBa_2Cu_3O_7$, $Bi_2Sr_2CaCu_2O_8$, LaNiO3, Hexagonal metals; $PtCoO2$, $PdCoO2$, or other delafossite structured hexagonal conductive oxides such as Al-doped ZnO. In some embodiments, spinels includes one or more of: Fe3O4 or LiV2O4. In some embodiments, cubic oxides includes Indium tin oxide or Sn-doped $In_2O_3$.

Figure 1B:
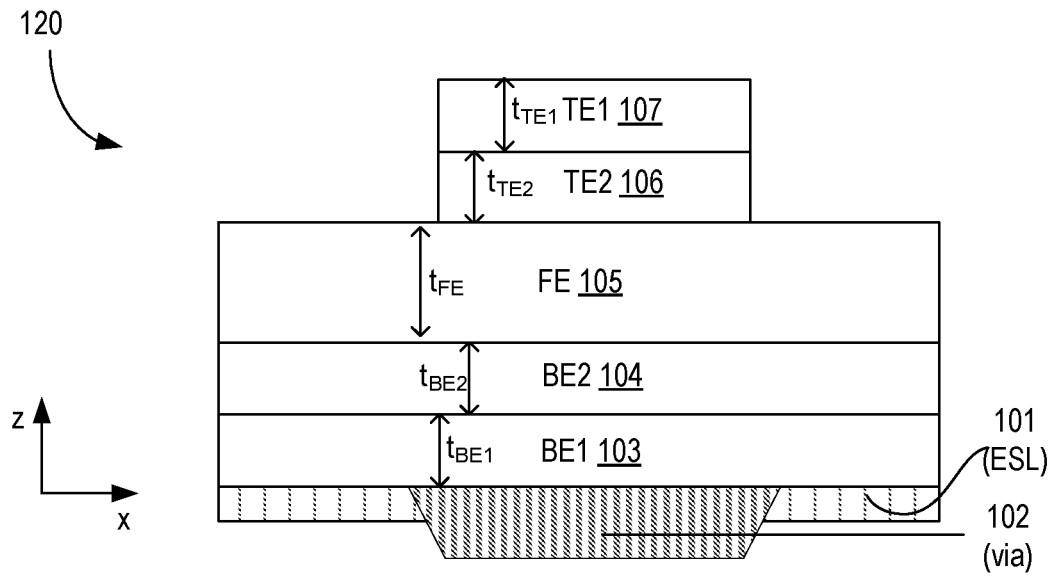

Cross-section 120, depicted in FIG. 1B, illustrates the stack after the top electrodes are etched up to where FE 105 surface begins. Here, TE1 107 and TE2 106 are etched to the top surface of FE 105. Any suitable vertical etching process may be used. For example, dry etch, wet etch, plasma etch, or reactive ion etching may be used to etch TE1 107 and TE2 106.

Figure 1C:
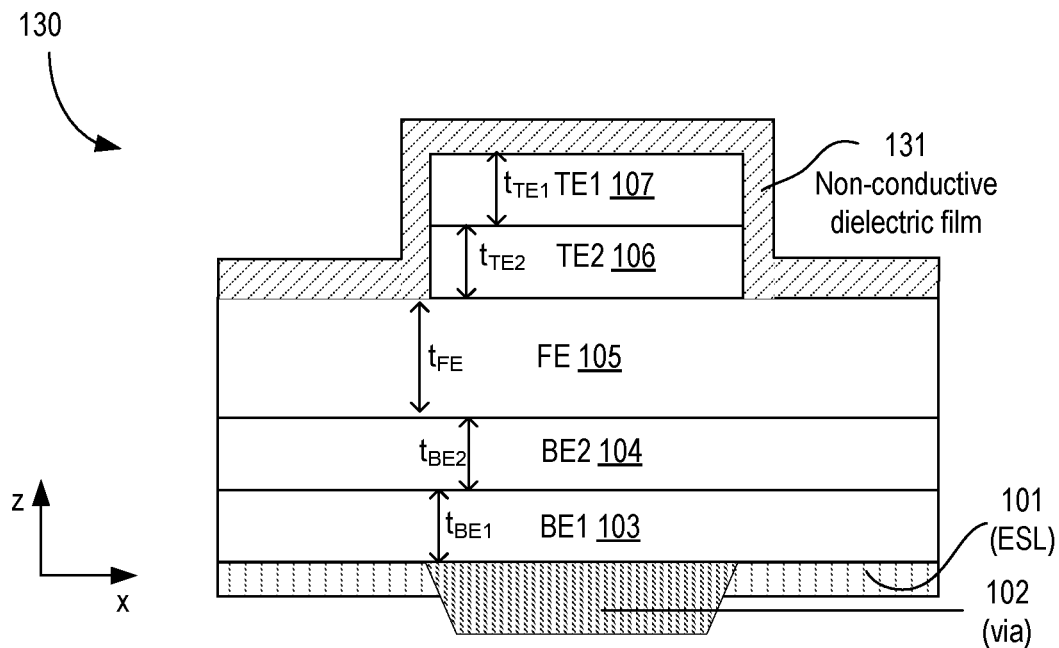

Cross-section 130, depicted in FIG. 1C, illustrates the stack after a non-conductive dielectric film 131 is conformably deposited over the etched electrodes TE1 107 and TE2 106. Non-conductive dielectric film 131 is also deposited over the exposed top surface of FE 105. The width $t_{ncd}$ is in a range of 1 nm to 20 nm. Here, the width extends in a direction orthogonal to a direction of the thickness. In some embodiments, non-conductive dielectric film 131 comprises one or more of: Hf, Si, N, Al, or C. In some embodiments, non-conductive dielectric film 131 includes one of: HfO, SiN, SiO, AlO, MgO, Mg2AlO3, or SiC. The non-conductive dielectric film 131 has minimal to no chemical or physical interaction (or diffusion interaction) with the FE properties of FE 105. In some embodiments, a hydrogen free deposition process is used to deposit non-conductive dielectric film 131 so that the deposition process does not impact the exposed FE 105.

Figure 1D:
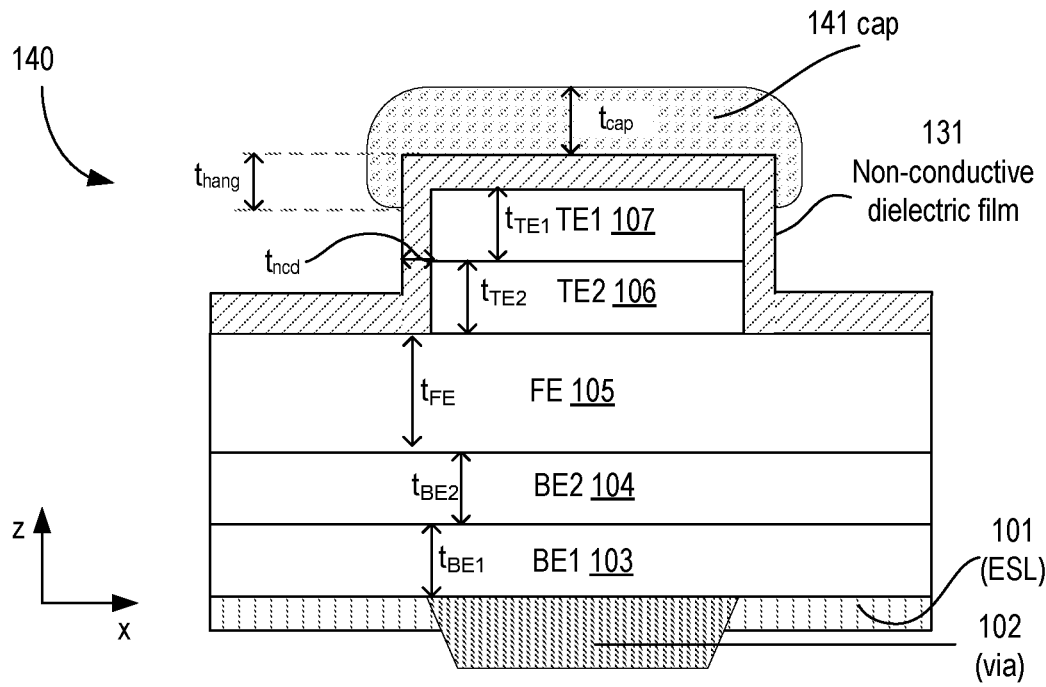

Cross-section 140, depicted in FIG. 1D, illustrates the stack after a metal cap or helmet 141 is deposited over the top section of the stack. In some embodiments, metal cap 141 is formed over a selective part of non-conductive dielectric 131, wherein metal cap 141 conforms to portions of sidewalls of the non-conductive dielectric 131, as shown. In some embodiments, cap, or helmet 141 comprises a material which includes one or more of: Ti, Ta, W, or N. For example, cap or helmet 141 comprises one of: TaN, TiN, W, Ta, Ti, or an alloy thereof. In some embodiments, physical vapor deposition (PVD) process is applied at a grazing angle to selectively deposit a metal mask forming helmet 141 over the selective part of the non-conductive dielectric. Grazing angle is an angle between the incident ray and the reflecting surface. Grazing angle is also referred to as clanking angle.

In some embodiments, Physical Vapor Deposition (PVD), Atomic Layer Deposition (ALD), Chemical Vapor Deposition (CVD), or Plasma-enhanced CVD is used instead of or in addition to the grazing process. The cap or helmet layer 141 is highly selective during etching of BE 103 and BE 104. In some embodiments, the etching rate of helmet layer 141 may be about 100 or 1000 times less than the etching rate for BE for a given BE etch chemistry. The thickness of cap 141 can be 10 A to 100 A. In some embodiments, the etchant is Ar, methanol, hydrogen, Ch4, H2, or CONH3 mixture as well as many others such as ion beam etching.

The hangover thickness $T_{hang}$ of metal cap 141 can be in a range of 1 nm to 100 nm. While metal cap 141 is an oval structure, it can have other shapes such as rectangular, circular, etc. The thickness of the metal cap as measured from a surface of non-conductive dielectric film 131 to the top of the metal cap along the z-direction is in a range of 20 Angstrom (A) to 500 A. In some embodiments, an ion implantation method is applied with turned etch rate to form metal cap 141. In some embodiments, the hangover part of helmet 141 may not extend down along all of the sidewalls of TE1 107. One purpose of metal cap 141 is to protect non-conductive dielectric 131 on sidewalls of TE1 107 and TE2 106.

Figure 1E:
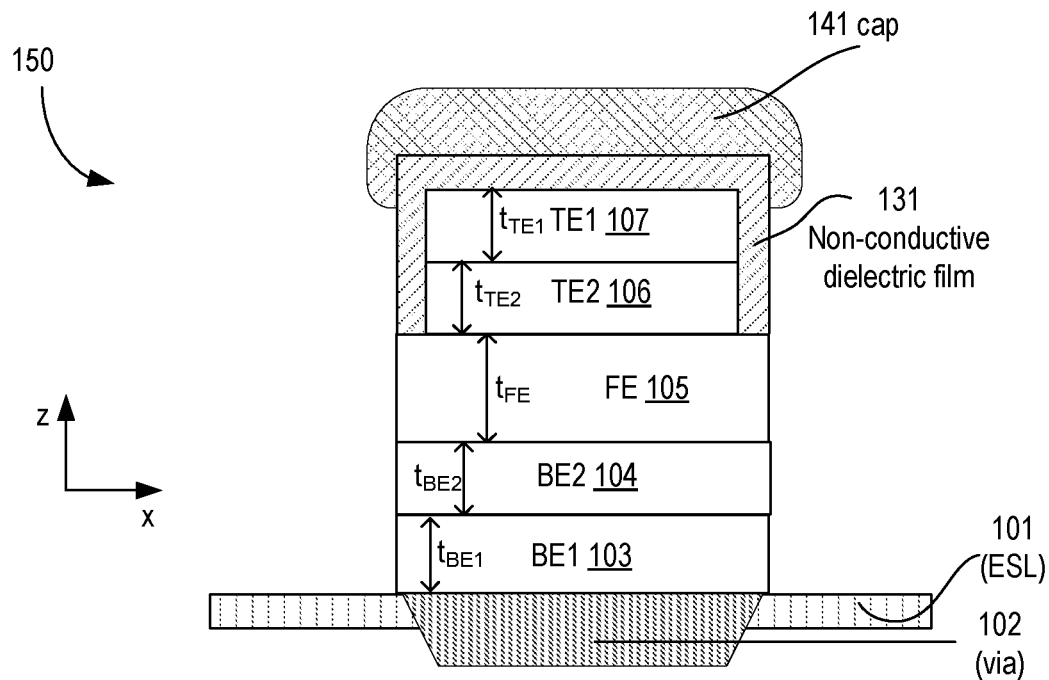
Figure 1F:
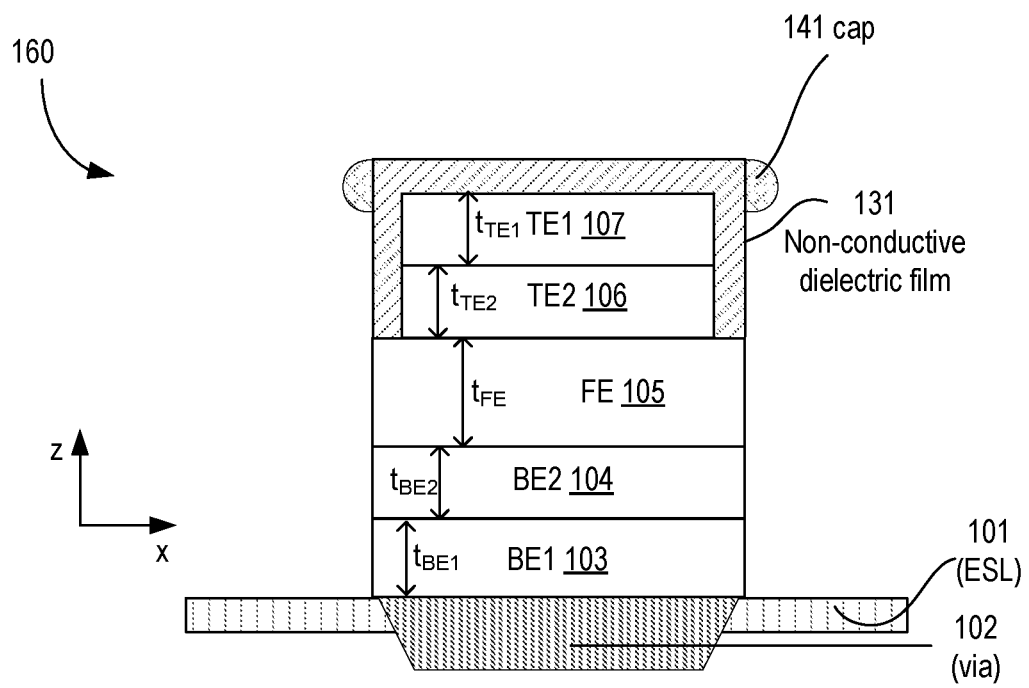

Cross-section 150, depicted in FIG. 1E, illustrates the stack after isotopically etching metal cap 141 and non-conductive dielectric 131 such that non-conductive dielectric 131 remains on sidewalls of the first and second electrodes (TE1 107 and TE2 106) but not on the third and fourth electrodes BE1 103 and BE2 104. In this example, non-conductive dielectric 131 is not on the sidewalls of FE 105. The isotopically etching metal cap 141 and non-conductive dielectric 131 results in vertical or near vertical etching of the stack of layers. In some embodiments, the length (along x-axis) of BE1 103 is longer than the length (along x-axis) of BE2 104. In some embodiments, the length (along x-axis) of FE 105 is shorter than the length (along x-axis) of BE2 104 but longer than the length (along x-axis) of TE2 106 and TE1 107 layers. For example, isotopically etching metal cap 141 and non-conductive dielectric 131 results in a width (or length along x-axis) of BE2 104 to be substantially a width (or length along x-axis) of a sum of widths (or length along x-axis) of the conformal non-conductive dielectric 131 on either sides of the TE1 107, and width (along x-axis) of the TE1 107.

Cross-section 160 illustrates the stack after removing metal cap 141 from a lateral surface of non-conductive dielectric 131 by etching or polishing the metal cap 141. The structure is now ready to be coupled to a transistor or another device. In some embodiments, the hangover portions of metal cap 141 is also removed by a selective etch process. In some embodiments, the process of FIG. 1E is skipped and cross-section 160 is achieved directly after cross-section 140 of FIG. 1D.

Figure 2A:
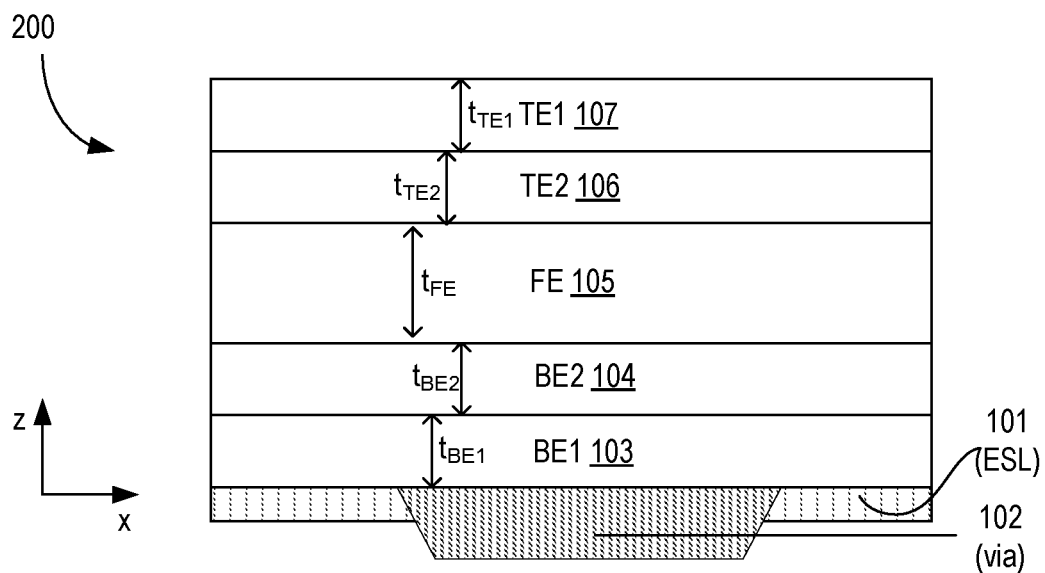
FIGS. 2A-F illustrate cross-sections of processes of forming/patterning a ferroelectric capacitor, in accordance with some embodiments.

FIGS. 2A-F illustrate cross-sections 200, 220, 230, 240, 250, and 260, respectively, of processes of forming/patterning a ferroelectric capacitor, in accordance with some embodiments. The processes as shown by various cross-sections are same as the processes of FIGS. 1A-F except that the stack of layers shown in cross-section 200 of FIG. 2A is etched down to the top surface of BE2 104 as shown by cross-section 220 of FIG. 2B. Here, in cross-section 230 of FIG. 2C, the non-conductive dialectic film 131 is conformably deposited along the sidewalls of FE 105, TE2 106, and TE1 107. A metal cap 141 is formed over the top surface of non-conductive file 131 as shown by cross-section 240. This is similar to the process described with reference to FIG. 1C.

Figure 2B:
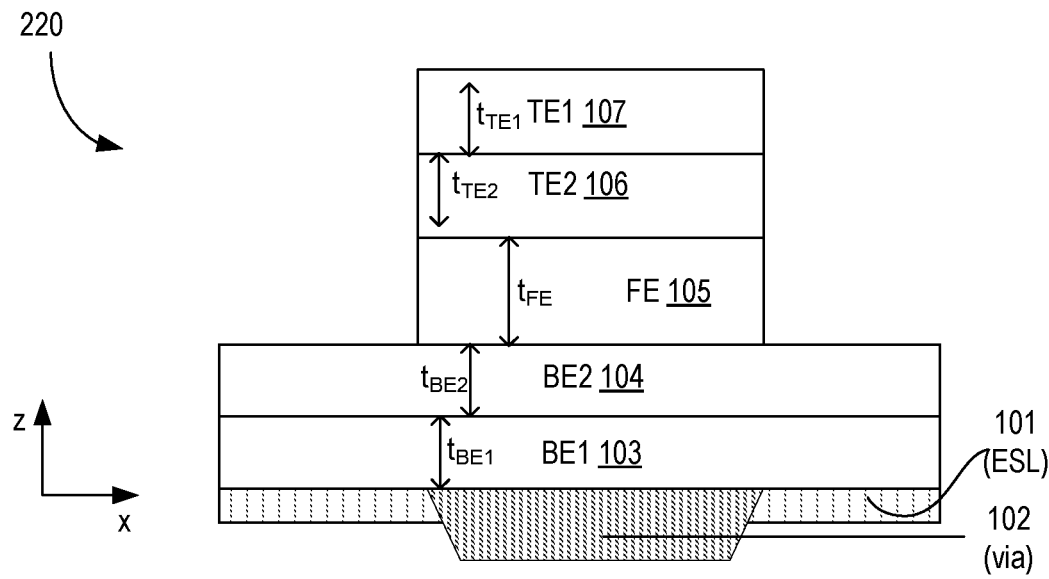
Figure 2C:
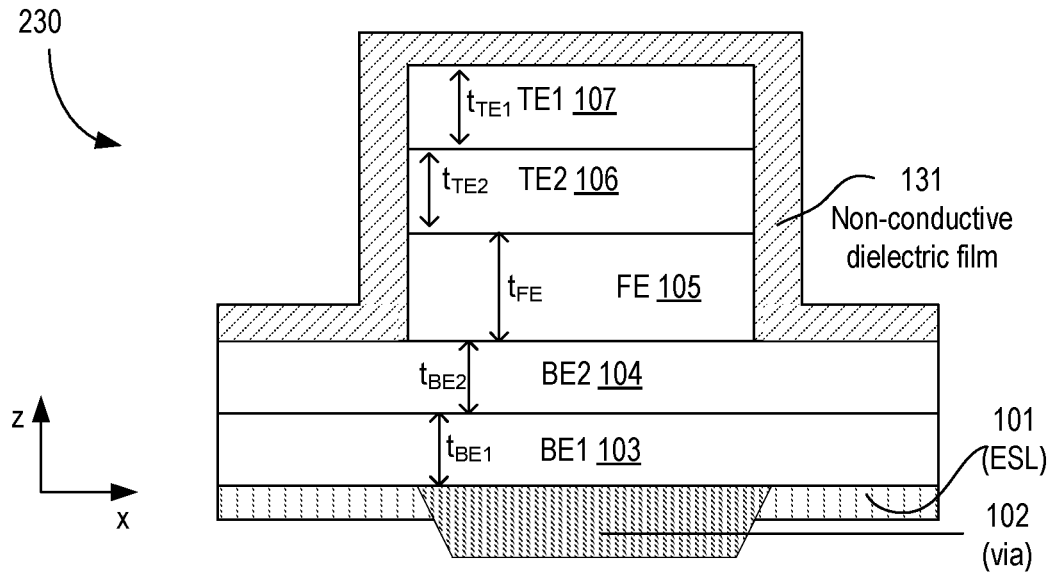
Figure 2D:
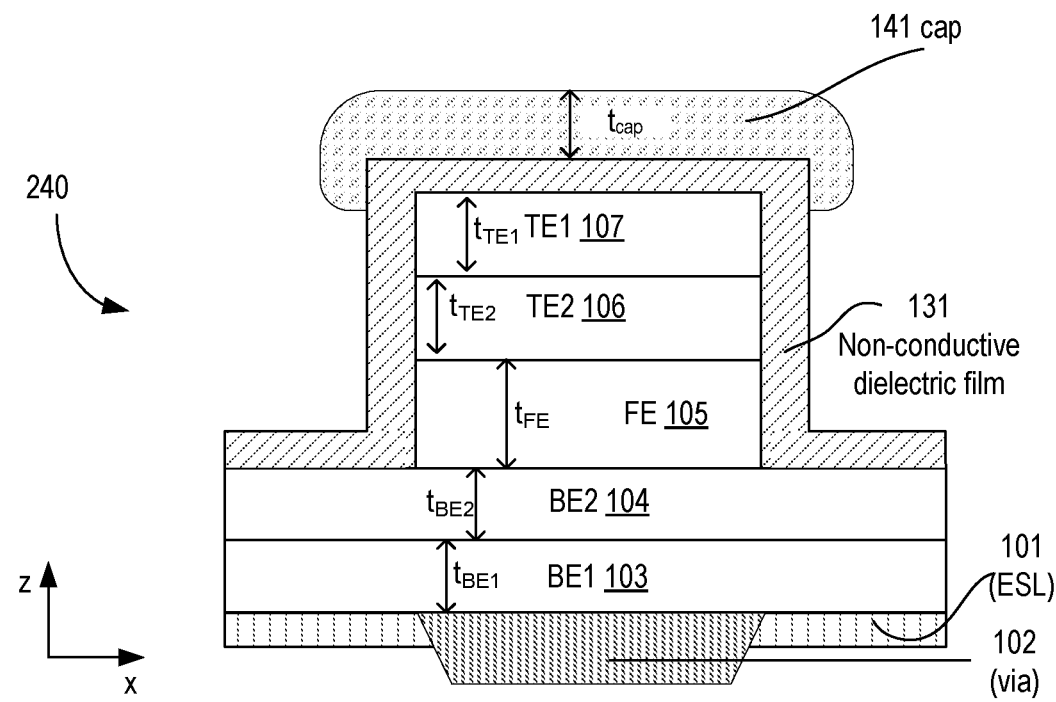
Figure 2E:
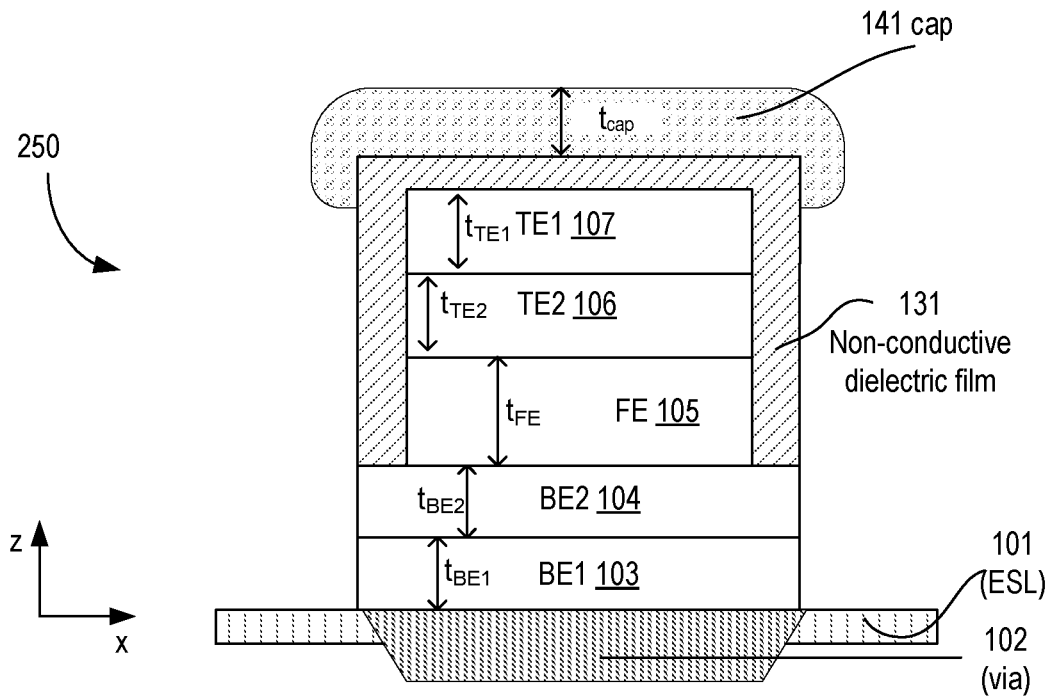
Figure 2F:
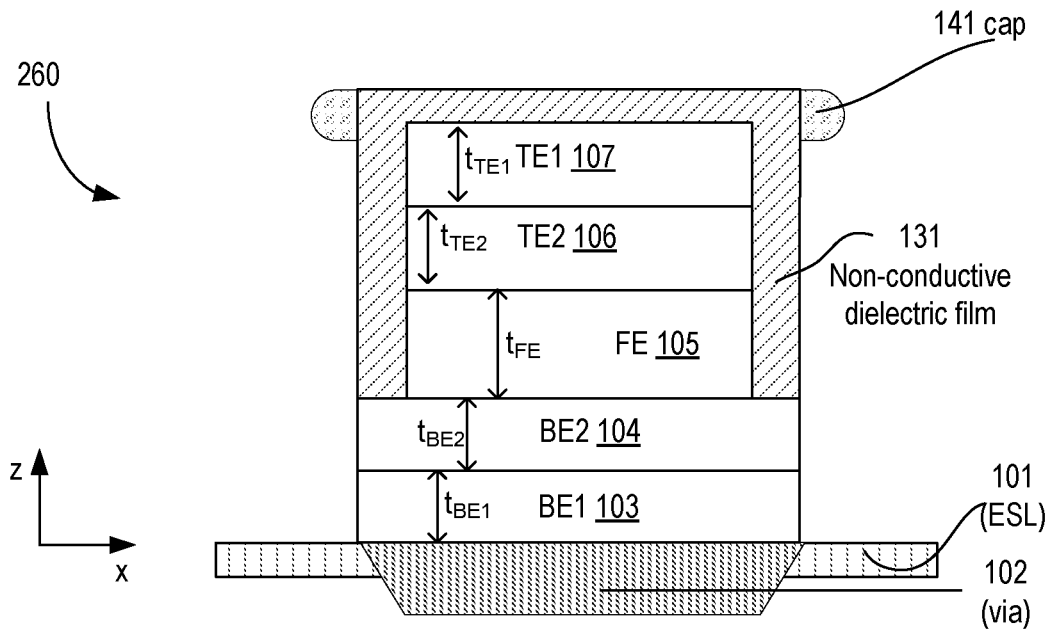

Cross-section 250, depicted in FIG. 2E, illustrates the stack after isotopically etching metal cap 141 and non-conductive dielectric 131 such that non-conductive dielectric 131 remains on sidewalls of the first and second electrodes (TE1 107 and TE2 106) and FE 105 but not on the third and fourth electrodes BE1 103 and BE2 104. The isotopically etching metal cap 141 and non-conductive dielectric 131 results in vertical or near vertical etching of the stack of layers. In some embodiments, the length (along x-axis) of BE1 103 is longer than the length (along x-axis) of BE2 104. Issues of etching the FE stack are not limited to re-deposition of the BE along the portion of the TE. Another issue involves when etching the FE stack, the TE or hard mask has material that has poor selectivity and is therefore consumed or damaged while etching the bottom electrode. The process described herein resolves these issues. Isotopically etching metal cap 141 and the non-conductive dielectric 131 results in a width (or length along x-axis) of BE2 104 to be substantially a width (or length along x-axis) of a sum of widths (or length along x-axis) of the conformal non-conductive dielectric on either sides of the TE1 107, and width of the TE1 107. Cross-section 260, of FIG. 2F, applies the same process as discussed with reference to FIG. 1F. In some embodiments, the process of FIG. 2E is skipped and cross-section 260 is achieved directly after cross-section 240.

Figure 3:
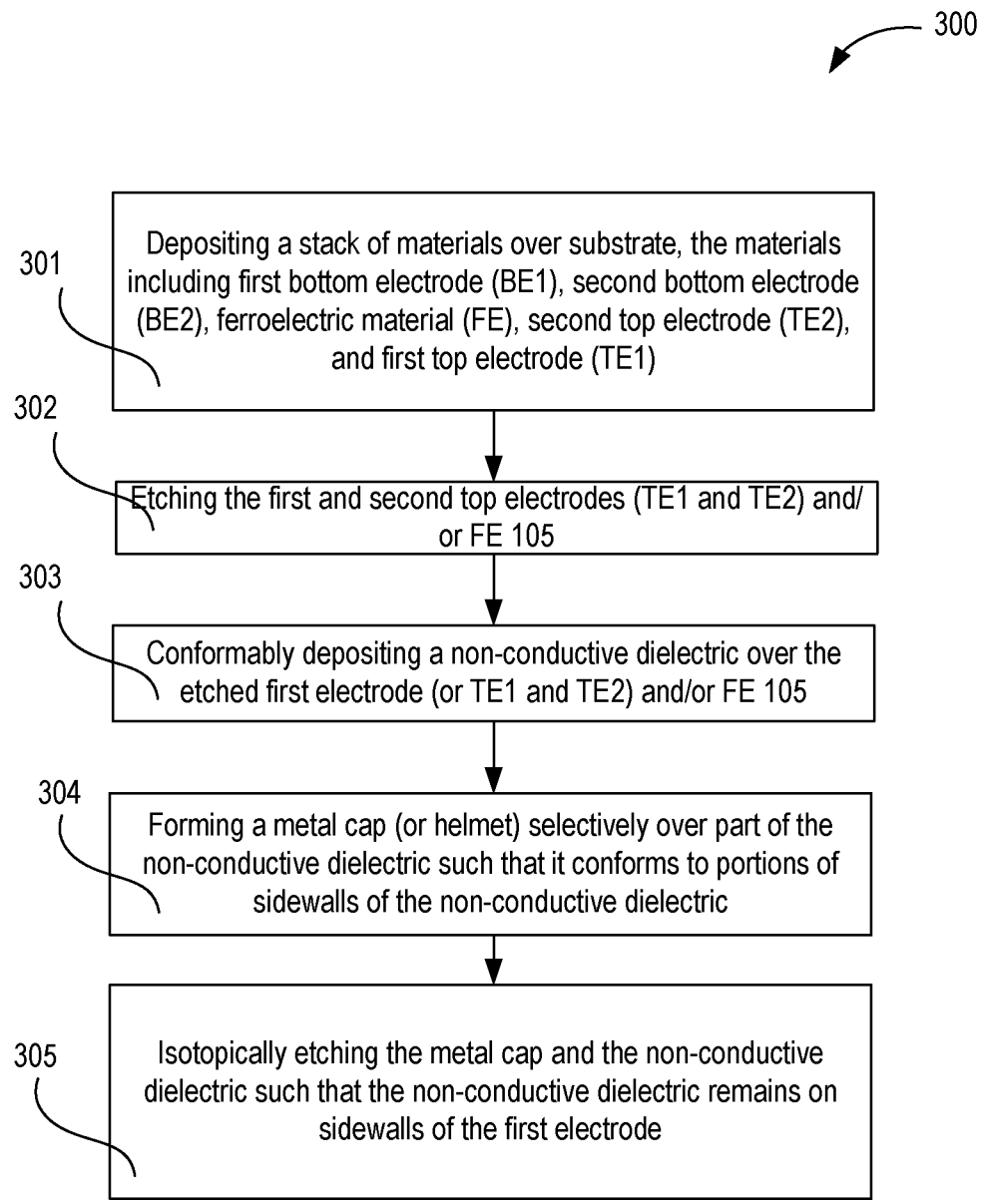
FIG. 3 illustrates a flowchart of method of forming a ferroelectric capacitor, in accordance with some embodiments.

FIG. 3 illustrates flowchart 300 of method of forming a ferroelectric capacitor, in accordance with some embodiments. Flowchart 300 illustrates the method described with reference to cross-sections of FIGS. 1A-F and FIGS. 2A-F. The method for forming a ferroelectric capacitive device, comprises: depositing a first electrode (e.g., TE1 107); depositing a second electrode (e.g., TE2 106) adjacent to the first electrode; depositing ferroelectric material (e.g., FE 105) adjacent to the second electrode; depositing a third electrode (e.g., BE2 104) adjacent to the ferroelectric material; and depositing a fourth electrode (e.g., BE1 103) adjacent to the third electrode. The first electrode includes first conductive material. The second electrode comprises second conductive material. The third electrode comprises third conductive material. The fourth electrode comprises fourth conductive material. The depositing of the various layers to form the stack of FIG. 1A is expressed by operation block 301. The process of depositing can be performed in any suitable order.

At block 302, the method of etching is performed wherein the first and second electrodes (TE1 and TE2) and/or FE 105 are etched as discussed with reference to FIG. 1B and FIG. 2B.

At block 303, the method conformably depositing non-conductive dielectric 131 is performed. In this method, non-conductive dielectric 131 is deposited over the etched first and second electrodes and/or FE 105.

At block 304, the method of forming metal cap 141 is performed. In this method, metal cap 141 is formed over a selective part of non-conductive dielectric 131, wherein metal cap 141 conforms to portions of sidewalls of the non-conductive dielectric. In some embodiments, the process of forming metal cap 141 comprises applying physical vapor deposition at a grazing angle to selectively deposit a metal mask over the selective part of the non-conductive dielectric. In another method, the process of forming metal cap 141 comprises applying ion implantation with tuned etch rate.

At block 305, the method of isotopically etching metal cap 141 and non-conductive dielectric 131 is performed. In this method, non-conductive dielectric 131 remains on sidewalls of the first and second electrodes, TE1 107 and TE2 106, respectively, (and/or FE 105), but not on the third and fourth electrodes BE2 104 and BE1 103, respectively.

In some embodiments, the method further comprises removing metal cap 141 from a lateral surface of non-conductive dielectric 131 by etching or polishing the metal cap.

Figure 4:
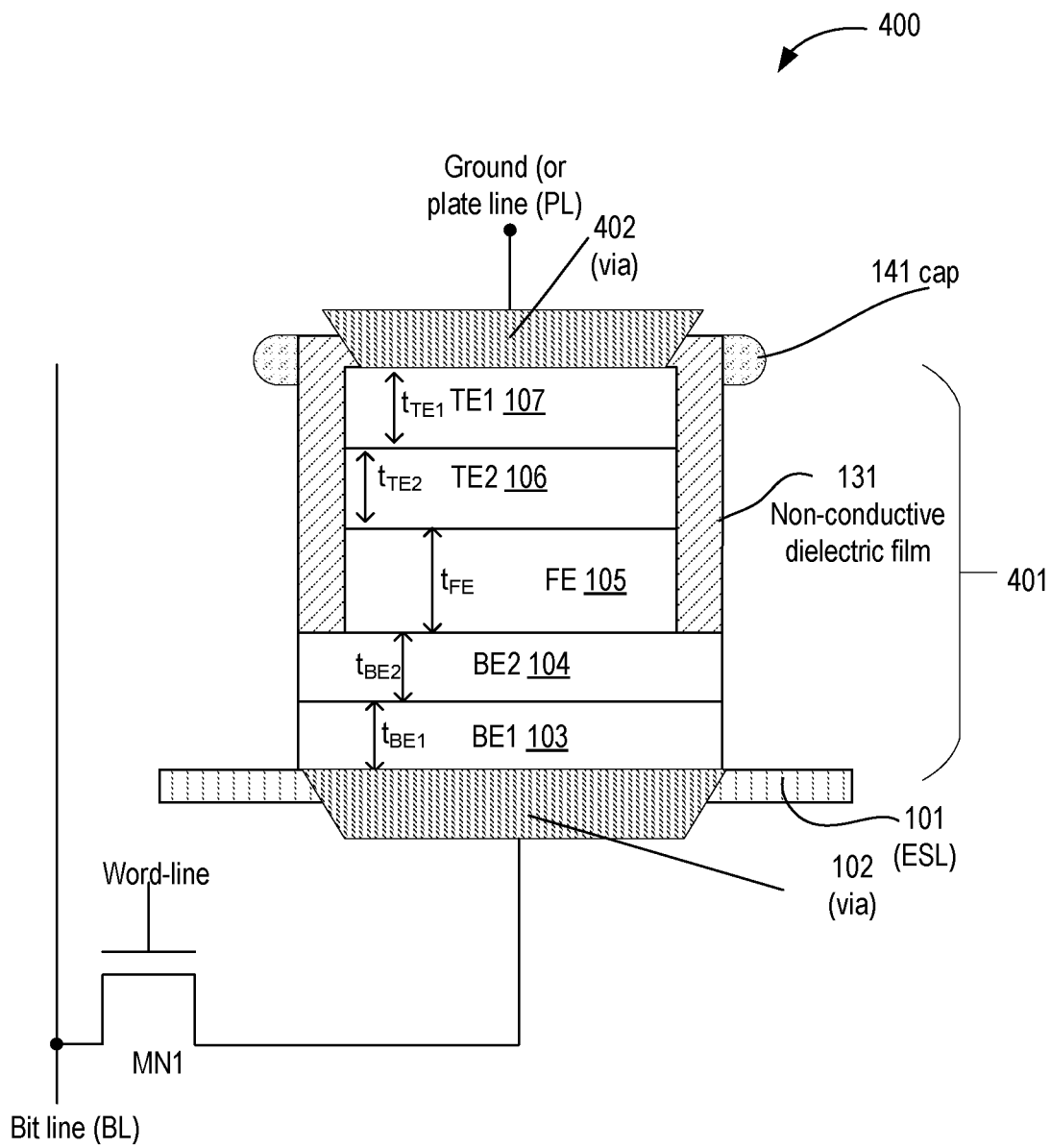
FIG. 4 illustrates a 1T-1C memory cell comprising the ferroelectric capacitor, in accordance with some embodiments.

FIG. 4 illustrates a 1T-1C memory cell 400 comprising the ferroelectric capacitor, in accordance with some embodiments. Memory cell 400 is one practical use of FE structure 401 formed using the various processes described with reference to FIGS. 1A-F, FIGS. 2A-F, and FIG. 3. Here, one-transistor, one-capacitor (1T-1C) device is illustrated. In some embodiments, an n-type transistor MN1 is formed and is coupled to FE capacitor 401.

In some embodiments, the gate of transistor MN1 is coupled to word-line (WL). One of source or drain region or terminal of transistor MN1 is coupled to bit-line (BL), and one of drain or source region of terminal of transistor MN is coupled to a metal region or connection 102. Here, a plate line (PL) or ground is coupled to metal region 402. Metal region 402 may be a via which is formed by selectively etching non-conductive dielectric film 131 to make a connection with TE 107. Material for via 402 can be the same as material for via 102, in accordance with some embodiments.

In some embodiments, a first barrier layer such as a refractive inter-conductive layer (not shown) is between the TE1 107 and contact or via 402. In some embodiments, a second barrier layer such as a refractive inter-conductive layer (not shown) is between the BE1 103 and contact or via 102. The barrier layer(s) are formed with refractive metals, also known as intermetallics, of controlled crystallinity. Materials for the barrier layer include one or more of: Ti—Al: Ti3 A1, TiAl, or TiAl3; Ni—Al: Ni3 A1, NiAl3, or NiAl; Ni—Ti, Ni—Ga, Ni2MnGa, FeGa, Fe3Ga, borides, carbides, or nitrides.

Transistor MN1 can be planar or non-planar transistor. In some embodiments, transistor MN1 can be formed in the frontend or backend. In some embodiments, FE structure 401 is formed in the frontend or backend. While transistor MN1 is illustrated as an n-type transistor, it can be replaced with a p-type transistor. The transistor here can be Square Wire, Rectangular Ribbon Transistor, Gate All Around Cylindrical Transistor, Tunneling FET (TFET), ferroelectric FET (FeFETs), bi-polar (BJT), BiCMOS, or other devices implementing transistor functionality, for instance, carbon nanotubes or spintronic devices. In some embodiments, the transistor is a typical metal oxide semiconductor (MOS) transistor or its derivative including Tri-Gate and FinFET transistors. While a MOSFET has symmetrical source and drain terminals, TFET device has asymmetric source and drain terminals.

Figure 5A:
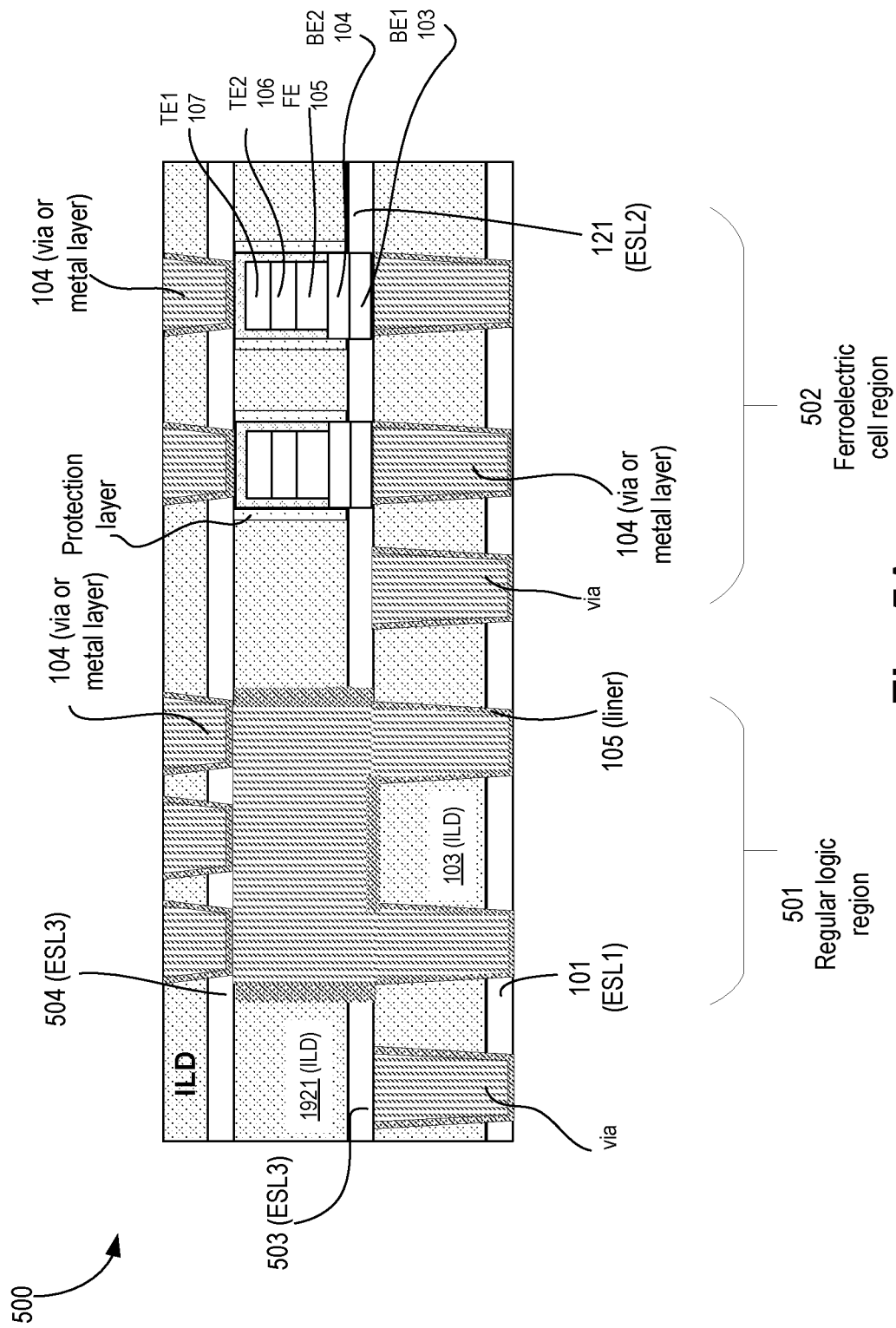
FIG. 5A illustrates a cross-section of a portion of a chip having traditional logic and ferroelectric capacitor, in accordance with some embodiments.

FIG. 5A illustrates cross-section 500 of a portion of a chip having traditional logic and ferroelectric capacitor, in accordance with some embodiments. In this multi-layer cross-section two regions are illustrated—regular logic region 501 and ferroelectric cell region 502. Vias 104 are provided to contact the TE1 107 and BE1 103. As such, 1T-1C cells (as shown in FIG. 4) can be realized. The process flow also allows for regular logic interconnect to couple to transistors in the frontend. ESL3 503 and 504 are used to provide etching stop layers as vias are formed and connected to interconnects and/or FE capacitor. ESL 503 and 504 can have same material as ESL1 101. While residue of helmet and cap 141 is shown, they can be removed in accordance with some embodiments. Here, some vias can be dummy (redundancy) vias or vias coupled to actual signal carrying interconnects.

Figure 5B:
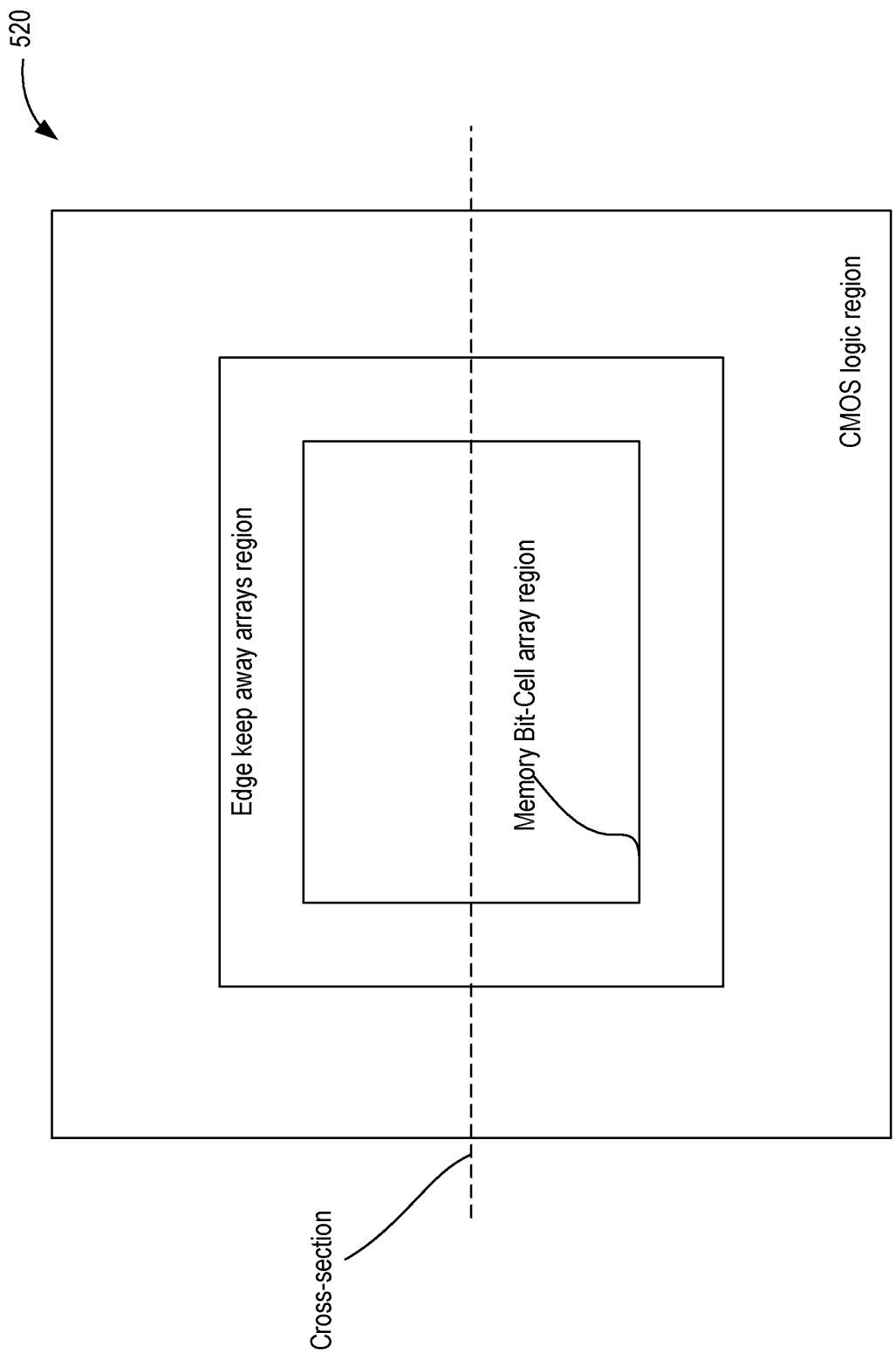
FIG. 5B illustrates a top view of FIG. 5A, in accordance with some embodiments.

FIG. 5B illustrates a top view 520 of FIG. 5A, in accordance with some embodiments.

Figure 6:
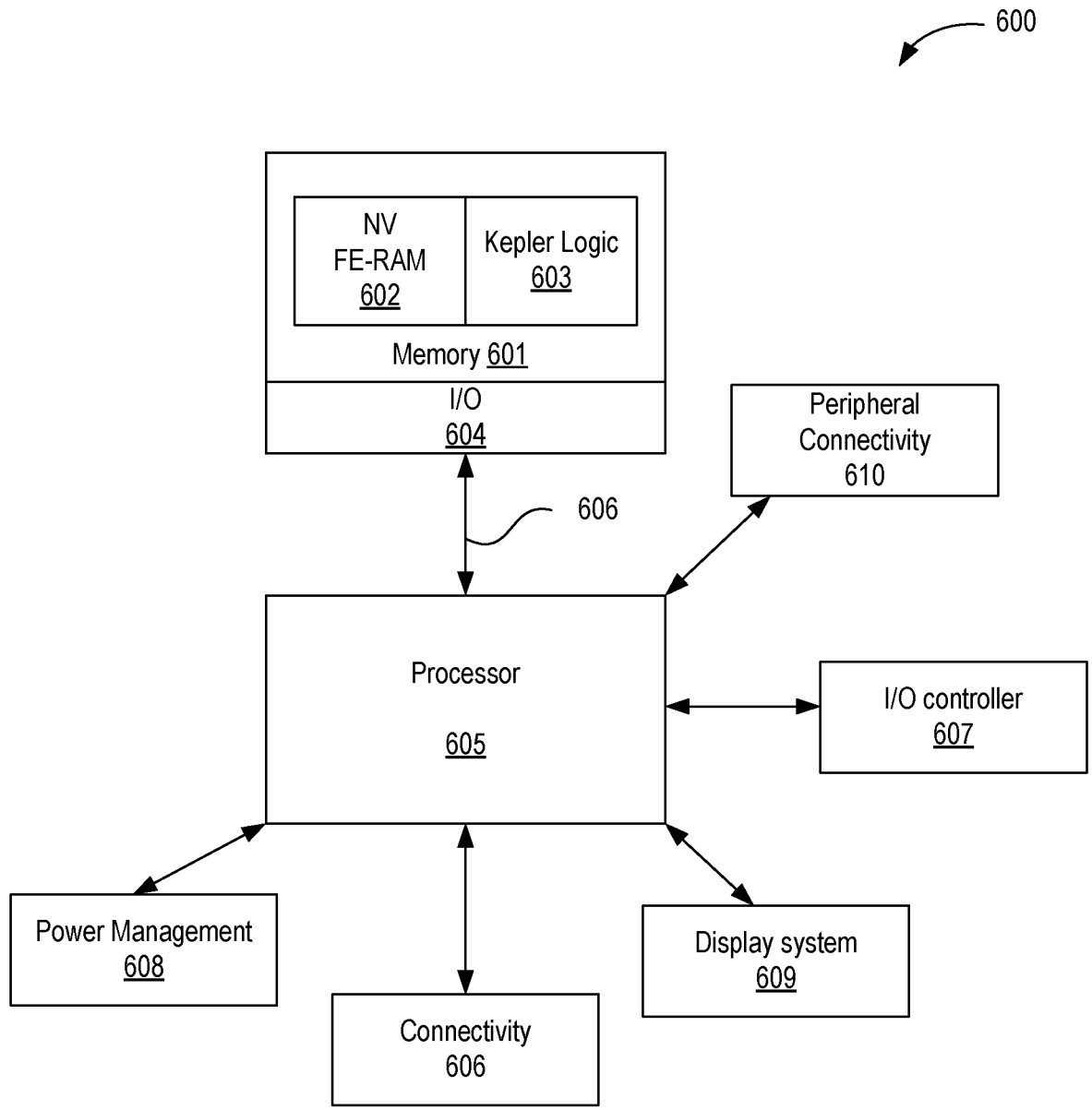
FIG. 6 illustrates a system-on-chip including memory having an array of 1T-1C bit-cells and logic, in accordance with some embodiments.

FIG. 6 illustrates system-on-chip (SOC) 600 including memory having an array of 1T-1C (one transistor, one capacitor) bit-cells and logic, in accordance with some embodiments. SOC 600 comprises memory 601 having non-volatile (NV) ferroelectric random access memory (FE-RAM) array 602. Memory module 601 further comprises CMOS logic 603 such as decoders, multiplexers, and drivers to drive BL (bit-line), WL (word-line), PL (plate-line). Memory module 601 further includes an input-output (TO) interface 604, which is used to communicate with another device such as processor 605 via interconnect 606.

SOC further comprises a memory I/O (input-output) interface 604. The interface may be double-data rate (DDR) compliant interface or any other suitable interface to communicate with a processor. Processor 605 of SOC 600 can be a single core or multiple core processor. Processor 605 can be a general-purpose processor, a digital signal processor (DSP), or an application specific integrated circuit (ASIC) processor. In some embodiments, processor 605 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property, or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 605 has reduced latency of computing the training model and using the training model, which reduces the power consumption of such AI processor systems.

Processor 605 may be coupled to a number of other chip-lets that can be on the same die as SOC 600 or on separate dies. These chip-lets include connectivity circuitry 606, I/O controller 607, power management 608, and display system 609, and peripheral connectivity 610.

Connectivity 606 represents hardware devices and software components for communicating with other devices. Connectivity 606 may support various connectivity circuitries and standards. For example, connectivity 606 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 606 may support non-cellular standards such as WiFi.

I/O controller 607 represents hardware devices and software components related to interaction with a user. I/O controller 607 is operable to manage hardware that is part of an audio subsystem and/or display subsystem. For example, input through a microphone or other audio device can provide input or commands for one or more applications or functions of SOC 600. In some embodiments, I/O controller 607 illustrates a connection point for additional devices that connect to SOC 600 through which a user might interact with the system. For example, devices that can be attached to the SOC 600 might include microphone devices, speaker or stereo systems, video systems or other display devices, keyboard or keypad devices, or other I/O devices for use with specific applications such as card readers or other devices.

Power management 608 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 608 may accordingly put such logic into low power state without the worry of losing data. Power management may select a power state according to Advanced Configuration and Power Interface (ACPI) specification for one or all components of SOC 600.

Display system 609 represents hardware (e.g., display devices) and software (e.g., drivers) components that provide a visual and/or tactile display for a user to interact with the processor 605. In some embodiments, display system 609 includes a touch screen (or touch pad) device that provides both output and input to a user. Display system 609 may include a display interface, which includes the particular screen or hardware device used to provide a display to a user. In some embodiments, the display interface includes logic separate from processor 605 to perform at least some processing related to the display.

Peripheral connectivity 610 may represent hardware devices and/or software devices for connecting to peripheral devices such as printers, chargers, cameras, etc. Peripheral connectivity 610 say support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a first electrode comprising first conductive material; a second electrode comprising second conductive material, the second electrode adjacent to the first electrode; a structure comprising ferroelectric material, the structure adjacent to the second electrode; a third electrode comprising third conductive material, the third electrode adjacent to the structure; a fourth electrode comprising fourth conductive material, the fourth electrode adjacent to the third electrode; and a dielectric adjacent to sidewalls of at least the first and second electrodes but not adjacent to the third electrode, and fourth electrode.

Example 2: The apparatus of example 1, wherein the dielectric is adjacent to sidewalls of the structure comprising the ferroelectric material.

Example 3: The apparatus of example 1 comprises portions of a cap or helmet adjacent to a portion of the dielectric, which is adjacent to at least a portion of the sidewalls of the first electrode.

Example 4: The apparatus of example 3, wherein the cap or helmet comprises a material which includes one or more of: Ti, Ta, W, or N.

Example 5: The apparatus of example 1, wherein the structure is wider than the second electrode, wherein the third electrode is wider than the structure, and wherein the fourth electrode is wider than the fourth electrode.

Example 6: The apparatus of example 1, wherein the first conductive material and the fourth conductive material includes one or more of: Ti, TiN, Ru, RuO2, IrO2, TaN, SrO, Ta, Cu, Co, W, or WN.

Example 7: The apparatus of example 1, wherein the first conductive material is different from the second conductive material.

Example 8: The apparatus of example 1, wherein the third conductive material is different from the fourth conductive material.

Example 9: The apparatus of example 1, wherein at least two of the first, second, third, and fourth conductive materials include conductive oxides.

Example 10: The apparatus of example 1, wherein the ferroelectric material includes one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), barium titanium-barium strontium titanium (BT-BST); perovskite includes one of: BaTiO3, PbTiO3, KNbO3, NaTaO3, LaCoO3, SrCoO3, SrRuO3, LaMnO3, SrMnO3, YBa2Cu3O7, Bi2Sr2CaCu2O8, or LaNiO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, lithium iron tantalum oxy fluoride, barium strontium niobate, sodium barium niobate, potassium strontium niobate; or improper ferroelectric includes one of: [PTO/STO]n or [LAO/STO]n, where 'n' is between 1 to 100.

Example 11: The apparatus of example 1, wherein the dielectric includes one or more of: HfO, SiN, SiO, AlO, MgO, Mg2AlO3, or SiC.

Example 12: The apparatus of example 1, wherein the dielectric is non-conductive and hydrogen free.

Example 13: The apparatus of example 1, wherein thicknesses of the first, second, third, and fourth electrodes, and the structure is at a range of 1 nm to 50 nm, and wherein a width of the non-conductive dielectric is an range of 1 nm to 20 nm, wherein the width extends in a direction orthogonal to a direction of the thickness.

Example 14: A method for forming a ferroelectric capacitive device, the method comprising: depositing a first electrode comprising first conductive material; depositing a second electrode adjacent to the first electrode, wherein the second electrode comprises second conductive material; depositing ferroelectric material adjacent to the second electrode; depositing a third electrode adjacent to the ferroelectric material, wherein the third electrode comprises third conductive material; depositing a fourth electrode adjacent to the third electrode, wherein the fourth electrode comprises fourth conductive material; etching the first and second electrodes; conformably depositing a non-conductive dielectric over the etched first and second electrodes; forming a metal cap over a selective part of the non-conductive dielectric, wherein the metal cap conforms to portions of sidewalls of the non-conductive dielectric; and isotopically etching the metal cap and the non-conductive dielectric such that non-conductive dielectric remains on sidewalls of the first and second electrodes but not on the third and fourth electrodes.

Example 15: The method of example 14, wherein forming, the metal cap over the selective part of the non-conductive dielectric, comprises: applying physical vapor deposition at a grazing angle to selectively deposit a metal mask over the selective part of the non-conductive dielectric.

Example 16: The method of example 14, wherein forming, the metal cap over the selective part of the non-conductive dielectric, comprises: applying ion implantation with tuned etch rate.

Example 17: The method of example 14 comprises removing metal cap from a lateral surface of the non-conductive dielectric by etching or polishing the metal cap.

Example 18: The method of example 14, wherein the ferroelectric material includes one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; relaxor ferroelectric includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), barium titanium-barium strontium titanium (BT-BST); perovskite includes one of: BaTiO3, PbTiO3, KNbO3, NaTaO3, LaCoO3, SrCoO3, SrRuO3, LaMnO3, SrMnO3, YBa2Cu3O7, Bi2Sr2CaCu2O8, or LaNiO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxides of the form, $Hf_{1-x}E_xO_y$ where E can be Al, Ca, Ce, Dy, er, Gd, Ge, La, Sc, Si, Sr, Sn, Y; $Al(1-x)Sc(x)N$, $Ga(1-x)Sc(x)N$, $Al(1-x)Y(x)N$ or $Al(1-y)Mg(x)Nb(y)N$, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, potassium strontium niobate; or improper ferroelectric includes one of: [PTO/STO]n or [LAO/STO]n, where 'n' is between 1 to 100.

Example 19: The method of example 14, wherein the dielectric is non-conductive and hydrogen free.

Example 20: The method of example 14, wherein thicknesses of the first, second, third, and fourth electrodes, and the structure is at a range of 1 nm to 50 nm, and wherein a width of the non-conductive dielectric is an range of 1 nm to 20 nm, wherein the width extends in a direction orthogonal to a direction of the thickness.

Example 21: The method of example 14, wherein isotopically etching the metal cap and the non-conductive dielectric such that a width of the third electrode is substantially a width of a sum of widths of the conformal non-conductive dielectric on either sides of the first electrode, and width of the first electrode.

Example 22: The method of example 14, wherein: the cap or helmet comprises a material which includes one or more of: Ti, Ta, W, or N; the first conductive material and the fourth material includes one or more of: Ti, TiN, Ru, RuO2, IrO2, TaN, SrO, Ta, Cu, Co, W, or WN; and the dielectric includes one or more of: HfO, SiN, SiO, AlO, SiC.

Example 23: A system comprising: a processor; a communication interface communicatively coupled to the processor; and a memory coupled to the processor, wherein the memory includes bit-cells, wherein one of the bit-cell includes: a transistor having a source, a drain, and a gate; a word-line coupled to the gate; a bit-line coupled to one of the source or drain of the transistor; a capacitive structure coupled to one of the drain or source of the transistor, wherein the capacitive structure comprises: a first electrode comprising first conductive material, wherein the first electrode is coupled to the one of the drain or source of the transistor; a second electrode comprising second conductive material, the second electrode adjacent to the first electrode; a structure comprising ferroelectric material, the structure adjacent to the second electrode; a third electrode comprising third conductive material, the third electrode adjacent to the structure; a fourth electrode comprising fourth conductive material, the fourth electrode adjacent to the third electrode; and a dielectric adjacent to sidewalls of at least the first and second electrodes but not adjacent to the third electrode, and fourth electrode.

Example 24: The system of example 23, wherein the dielectric is adjacent to sidewalls of the structure comprising the ferroelectric material, and wherein the memory is non-volatile memory.

Example 25: The system of example 23, wherein the capacitive structure comprises portions of a cap or helmet adjacent to a portion of the dielectric, which is adjacent to at least a portion of the sidewalls of the first electrode.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a first electrode comprising a first conductive material;
a first structure comprising a non-linear polar material, the first structure adjacent to the first electrode, wherein the first electrode is laterally on the first structure;

a second electrode comprising a second conductive material, the second electrode adjacent to the first structure, wherein the first structure is laterally on the second electrode;
a dielectric which abuts to sidewalls of the first electrode, wherein the dielectric is directly adjacent to sidewalls of the first structure, and wherein the dielectric does not abut to sidewalls of the second electrode; and
a cap or a helmet, wherein the cap or the helmet circumscribes the dielectric, and wherein the cap or the helmet does not extend below the first structure.

2. The apparatus of claim 1, wherein the non-linear polar material includes one of:
bismuth ferrite (BFO) or BFO with a first doping material, wherein the first doping material is one of Lanthanum or elements from lanthanide series of periodic table, Mn, or Sc;
lead zirconium titanate (PZT) or PZT with a second doping material, wherein the second doping material is one of La or Nb;
a relaxor ferroelectric, which includes one of; lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
a perovskite which includes one of: $BaTiO_3$, $PbTiO_3$, $KNbO_3$, or $NaTaO_3$;
a first hexagonal ferroelectric which includes one of: $YMnO_3$ or $LuFeO_3$;
a second hexagonal ferroelectric of a type h-$RMnO_3$, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
hafnium (Hf), zirconium (Zr), aluminum (Al), silicon (Si), their oxides, or their alloyed oxides;
hafnium oxides of a form $Hf_{1-x}E_xO_y$ where E includes one of Al, Ca, Ce, Dy, Er, Gd, Ge, La, Sc, Si, Sr, Sn, or Y, where x and y are first and second fractions, respectively;
$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein x and y are third and fourth fractions, respectively;
doped $HfO_2$;
niobate type compounds $LiNbO_3$, $LiTaO_3$, lithium iron tantalum oxyfluoride, barium strontium niobate, sodium barium niobate, or potassium strontium niobate; or
an improper ferroelectric which includes one of: [PTO/STO]n or [LAO/STO]n, where 'n' is between 1 and 100.

3. The apparatus of claim 1, wherein the dielectric comprises a substantially uniform thickness on vertical sidewalls of the first electrode, and on the sidewalls of the first structure.

4. The apparatus of claim 2, wherein the dielectric is on at least a portion of an uppermost surface of the second electrode, and wherein the dielectric comprises a sidewall that is substantially aligned with vertical sidewalls of the second electrode.

5. The apparatus of claim 1, wherein the first electrode comprises a first length measured orthogonally with respect to the sidewalls of the first electrode, wherein the dielectric comprises a second length measured orthogonally away from the sidewalls of the first structure, wherein the second electrode comprises a third length measured orthogonally with respect to the sidewalls of the first electrode, and wherein the third length is substantially equal to a sum of the first length and two times the second length.

6. The apparatus of claim 1, wherein the dielectric includes one or more of: HfO, SiN, SiO, AlO, MgO, $Mg_2AlO_3$, or SiC.

7. The apparatus of claim 1, wherein the cap laterally extends beyond vertical sidewalls of the second electrode.

8. The apparatus of claim 1, wherein the cap does not extend to the first structure.

9. The apparatus of claim 1, wherein the cap comprises an oval, rectangular or circular structure.

10. The apparatus of claim 1, wherein the cap comprises a thickness measured vertically upwards from an upper surface of the dielectric, wherein the thickness is in a range of 20 Angstroms to 500 Angstroms.

11. The apparatus of claim 1, wherein the first electrode and the second electrode comprise one of Ti, TiN, Ru, $RuO_2$, $IrO_2$, $PdO_2$, $OsO_2$, or $ReO_3$, TaN, SrO, Ta, Cu, Co, W, or WN; or conductive perovskites including one or more of $LaCoO_3$, $SrCoO_3$, $SrRuO_3$, $LaMnO_3$, $SrMnO_3$, $YBa_2Cu_3O_7$, $Bi_2Sr_2CaCu_2O_8$, or $LaNiO_3$; hexagonal metals including one or more of $PtCoO_2$ or $PdCoO_2$; delafossite structured hexagonal conductive oxides including Al-doped ZnO; spinels including one or more of $Fe_3O_4$ or $LiV_2O_4$; or cubic oxides including indium tin oxide or Sn-doped $In_2O_3$.

12. The apparatus of claim 1, wherein the first electrode comprise one of Ti, TiN, Ru, $RuO_2$, $IrO_2$, $PdO_2$, $OsO_2$, or $ReO_3$, TaN, SrO, Ta, Cu, Co, W, or WN; or conductive perovskites including one or more of $LaCoO_3$, $SrCoO_3$, $SrRuO_3$, $LaMnO_3$, $SrMnO_3$, $YBa_2Cu_3O_7$, $Bi_2Sr_2CaCu_2O_8$, or $LaNiO_3$; hexagonal metals including one or more of $PtCoO_2$ or $PdCoO_2$; delafossite structured hexagonal conductive oxides including Al-doped ZnO; spinels including one or more of $Fe_3O_4$ or $LiV_2O_4$; cubic oxides including indium tin oxide or Sn-doped $In_2O_3$, and the second electrode comprises one of Ti, TiN, Ru, $RuO_2$, $IrO_2$, $PdO_2$, $OsO_2$, or $ReO_3$, TaN, SrO, Ta, Cu, Co, W, or WN; or conductive perovskites including one or more of: $LaCoO_3$, $SrCoO_3$, $SrRuO_3$, $LaMnO_3$, $SrMnO_3$, $Yba_2Cu_3O_7$, $Bi_2Sr_2CaCu_2O_8$, or $LaNiO_3$; hexagonal metals including one or more of $PtCoO_2$ or $PdCoO_2$; delafossite structured hexagonal conductive oxides including Al-doped ZnO; spinels including one or more of $Fe_3O_4$ or $LiV_2O_4$; or cubic oxides including indium tin oxide or Sn-doped $In_2O_3$.

13. An apparatus comprising:
logic over a substrate, wherein the logic is coupled to one or more vias through one or more interlayer dielectric (ILD);
a capacitor comprising non-linear polar material, wherein the capacitor is above and in contact with the one or more vias, and wherein the capacitor includes:
a first electrode comprising a first conductive material;
a first structure comprising the non-linear polar material, the first structure adjacent to the first electrode, wherein the first electrode is laterally on the first structure;
a second electrode comprising a second conductive material, the second electrode adjacent to the first structure, wherein the first structure is laterally on the second electrode;
a dielectric which abuts to vertical sidewalls of the first electrode, wherein the dielectric is directly adjacent to sidewalls of the first structure, and wherein the dielectric does not abut to vertical sidewalls of the second electrode; and a cap or a helmet, wherein the cap or the helmet circumscribes the dielectric, and wherein the cap or the helmet does not extend below the first structure;

a first interconnect or a first via coupled with the first electrode; and a second interconnect or a second via coupled with the second electrode.

14. The apparatus of claim 13, wherein the first via is on at least a portion of the first electrode, wherein the first via comprises one or more of W, Cu, Ta, Ti, Co, Al, Ag, or TaN, and wherein the second via comprises one or more of W, Cu, Ta, Ti, Co, Al, Ag, or TaN.

15. The apparatus of claim 13, wherein the non-linear polar material includes one of:

bismuth ferrite (BFO) or BFO with a first doping material, wherein the first doping material is one of Lanthanum or elements from lanthanide series of periodic table, Mn, or Sc;

a class of materials comprising La or rare earth elements substituted into Bi site in $BiFeO_3$, $BiCrO_3$, or $BiCoO_3$;

lead zirconium titanate (PZT) or PZT with a second doping material, wherein the second doping material is one of La or Nb;

a relaxor ferroelectric, which includes one of; lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a perovskite which includes one of: $BaTiO_3$, $PbTiO_3$, $KNbO_3$, or $NaTaO_3$;

a first hexagonal ferroelectric which includes one of: $YMnO_3$ or $LuFeO_3$;

a second hexagonal ferroelectrics of a type h-$RMnO_3$, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

hafnium (Hf), zirconium (Zr), aluminum (Al), silicon (Si), their oxides, or their alloyed oxides;

hafnium oxides of a form $Hf_{1-x}E_xO_y$, where E includes one of Al, Ca, Ce, Dy, Er, Gd, Ge, La, Sc, Si, Sr, Sn, or Y, wherein x and y are first and second fractions respectively;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein x and y are third and fourth fractions, respectively;

doped $HfO_2$;

niobate type compounds $LiNbO_3$, $LiTaO_3$, lithium iron tantalum oxyfluoride, barium strontium niobate, sodium barium niobate, or potassium strontium niobate; or an improper ferroelectric which includes one of: [PTO/STO]n or [LAO/STO]n, where 'n' is between 1 and 100.

16. The apparatus of claim 13 further comprising a layer between the second electrode and the first structure, wherein the layer comprises $LaCoO_3$, $SrCoO_3$, $SrRuO_3$, $LaMnO_3$, $SrMnO_3$, $YBa_2Cu_3O_7$, $Bi_2Sr_2CaCu_2O_8$, or $LaNiO_3$, and wherein the second electrode comprises $IrO_2$, $RuO_2$, $PdO_2$, or $PtO_2$.

17. The apparatus of claim 16, wherein the layer comprises a thickness of 10 nm or less.

18. The apparatus of claim 13 further comprising a first etch stop layer adjacent to the first interconnect or the first via, wherein a portion of the first etch stop layer is in contact with the dielectric and the cap, and wherein the first etch stop layer comprises a material that has very different etch characteristics than materials of the first electrode, the second electrode, and the first structure.

19. The apparatus of claim 13 further comprising a second etch stop layer adjacent to the second interconnect or the second via, wherein the second etch stop layer comprises a material that has very different etch characteristics than materials of the first electrode, the second electrode, and the first structure.

20. A system comprising:

a processor;

a communication interface communicatively coupled to the processor; and a memory coupled to the processor, wherein the memory includes bit-cells, wherein one of the bit-cells includes:

a transistor having a source, a drain, and a gate;

a word-line coupled to the gate;

a bit-line coupled to one of the source or the drain of the transistor;

logic over a substrate, wherein the logic is coupled to one or more vias through one or more interlayer dielectric (ILD);

a capacitor comprising non-linear polar material, wherein the capacitor is adjacent to the one or more vias, wherein the capacitor is coupled to one of the drain or the source of the transistor, and wherein the capacitor comprises:

a first electrode comprising a first conductive material;

a first structure comprising the non-linear polar material, the first structure adjacent to the first electrode, wherein the first electrode is laterally on the first structure;

a second electrode comprising a second conductive material, the second electrode adjacent to the first structure, wherein the first structure is laterally on the second electrode;

a dielectric which abuts to vertical sidewalls of the first electrode, wherein the dielectric is directly adjacent to sidewalls of the first structure, and wherein the dielectric does not abut to vertical sidewalls of the second electrode; and a cap or a helmet, wherein the cap or the helmet circumscribes the dielectric, and wherein the cap or the helmet does not extend below the first structure;

a first interconnect or a first via coupled with the first electrode; and a second interconnect or a second via coupled with the second electrode.

21. The system of claim 20, wherein the processor comprises a second transistor, wherein the second transistor includes tunneling FET (TFET), ferroelectric FET (FeFETs), bi-polar (BJT), BiCMOS, carbon nanotubes, or spintronic devices, and wherein the transistor comprises a square wire, rectangular ribbon transistor, tri-gate, or gate all around cylindrical geometry.

22. The system of claim 20, wherein the memory is a non-volatile memory.

23. The system of claim 20, wherein the non-linear polar material includes one of:

bismuth ferrite (BFO) or BFO with a first doping material, wherein the first doping material is one of Lanthanum or elements from lanthanide series of periodic table, Mn, or Sc;

lead zirconium titanate (PZT) or PZT with a second doping material, wherein the second doping material is one of La or Nb;

a relaxor ferroelectric, which includes one of; lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a perovskite which includes one of: $BaTiO_3$, $PbTiO_3$, $KNbO_3$, or $NaTaO_3$;

a first hexagonal ferroelectric which includes one of: $YMnO_3$ or $LuFeO_3$;

a second hexagonal ferroelectrics of a type h-$RMnO_3$, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

hafnium (Hf), zirconium (Zr), aluminum (Al), silicon (Si), their oxides, or their alloyed oxides;

hafnium oxides of a form $Hf_{1-x}E_xO_y$ where E includes one of Al, Ca, Ce, Dy, Er, Gd, Ge, La, Sc, Si, Sr, Sn, or Y, wherein x and y are first and second fractions, respectively;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein x and y are third and fourth fractions, respectively;

doped $HfO_2$;

niobate type compounds $LiNbO_3$, $LiTaO_3$, lithium iron tantalum oxyfluoride, barium strontium niobate, sodium barium niobate, or potassium strontium niobate; or an improper ferroelectric which includes one of: [PTO/STO]n or [LAO/STO]n, where 'n' is between 1 and 100.

* * * * *